US010121898B2

(12) United States Patent
Sugawara

(10) Patent No.: US 10,121,898 B2
(45) Date of Patent: Nov. 6, 2018

(54) THIN-FILM TRANSISTOR SUBSTRATE AND METHOD OF MANUFACTURING THE SAME

(71) Applicant: JOLED INC., Chiyoda-ku, Tokyo (JP)

(72) Inventor: Yuta Sugawara, Tokyo (JP)

(73) Assignee: JOLED INC., Tokyo (JP)

( * ) Notice: Subject to any disclaimer, the term of this patent is extended or adjusted under 35 U.S.C. 154(b) by 40 days.

(21) Appl. No.: 15/309,794

(22) PCT Filed: Apr. 17, 2015

(86) PCT No.: PCT/JP2015/002131
§ 371 (c)(1),
(2) Date: Nov. 8, 2016

(87) PCT Pub. No.: WO2015/170450
PCT Pub. Date: Nov. 12, 2015

(65) Prior Publication Data
US 2017/0250289 A1    Aug. 31, 2017

(30) Foreign Application Priority Data

May 9, 2014    (JP) ................................ 2014-098127

(51) Int. Cl.
| H01L 29/786 | (2006.01) |
| H01L 27/12 | (2006.01) |
| H01L 21/02 | (2006.01) |
| H01L 29/24 | (2006.01) |

(Continued)

(52) U.S. Cl.
CPC .. *H01L 29/78606* (2013.01); *H01L 21/02164* (2013.01); *H01L 21/02178* (2013.01);
(Continued)

(58) Field of Classification Search
CPC ............ H01L 29/78606; H01L 29/247; H01L 29/78693; H01L 21/02164;
(Continued)

(56) References Cited

U.S. PATENT DOCUMENTS

| 2010/0193772 A1 | 8/2010 | Morosawa et al. |
| 2012/0112182 A1 | 5/2012 | Ishii et al. |

(Continued)

FOREIGN PATENT DOCUMENTS

| JP | 2007-311404 A | 11/2007 |
| JP | 2010-182819 A | 8/2010 |

(Continued)

OTHER PUBLICATIONS

International Search Report in International Patent Application No. PCT/JP2015/002131, dated Jun. 23, 2015.

*Primary Examiner* — Cuong Q Nguyen
*Assistant Examiner* — Tong-Ho Kim
(74) *Attorney, Agent, or Firm* — Hauptman Ham, LLP

(57) ABSTRACT

A method of manufacturing a TFT substrate includes the steps of forming an oxide semiconductor layer above a substrate, forming a first oxide film on the oxide semiconductor layer, performing oxidation processing on the oxide semiconductor layer after formation of the first oxide film, and forming a second oxide film on the first oxide film after the oxidation processing.

18 Claims, 16 Drawing Sheets

(51) Int. Cl.
*H01L 27/32* (2006.01)

(52) U.S. Cl.
CPC .. *H01L 21/02233* (2013.01); *H01L 21/02252* (2013.01); *H01L 21/02565* (2013.01); *H01L 21/02592* (2013.01); *H01L 27/127* (2013.01); *H01L 27/1225* (2013.01); *H01L 29/247* (2013.01); *H01L 29/78693* (2013.01); *H01L 27/3262* (2013.01)

(58) Field of Classification Search
CPC ......... H01L 21/02178; H01L 21/02233; H01L 21/02252; H01L 21/02565; H01L 21/02592; H01L 27/1225; H01L 21/127; H01L 21/3262
USPC .............................................. 257/43; 438/104
See application file for complete search history.

(56) References Cited

U.S. PATENT DOCUMENTS

| | | |
|---|---|---|
| 2013/0056728 A1 | 3/2013 | Morosawa et al. |
| 2013/0187153 A1* | 7/2013 | Yamazaki ......... H01L 29/78606 257/43 |
| 2015/0318400 A1* | 11/2015 | Morita .................. C01G 19/00 257/43 |
| 2016/0284855 A1 | 9/2016 | Yamazaki et al. |

FOREIGN PATENT DOCUMENTS

| | | |
|---|---|---|
| JP | 2012-99757 A | 5/2012 |
| JP | 2013-175713 A | 9/2013 |
| JP | 2013-201428 A | 10/2013 |

* cited by examiner

THIN-FILM TRANSISTOR SUBSTRATE AND METHOD OF MANUFACTURING THE SAME

RELATED APPLICATIONS

The present application is a National Phase entry of International Application No. PCT/JP2015/002131, filed Apr. 17, 2015, which claims priority of Japanese Application No. 2014-098127, filed May 9, 2014.

TECHNICAL FIELD

The present disclosure relates to a thin-film transistor substrate including an oxide semiconductor and a method of manufacturing the same.

BACKGROUND ART

Active matrix display devices such as liquid crystal display devices and organic electroluminescent (EL) display devices widely use thin-film transistors (TFTs) as switching elements or driver elements.

In recent years, active research and development have been conducted on structures that include an oxide semiconductor such as zinc oxide (ZnO), indium gallium oxide (InGaO), or indium gallium zinc oxide (InGaZnO) as channel layers of TFTs. The TFTs including the oxide semiconductor as their channel layers are characterized by having a small off-state current, exhibiting high carrier mobility even in an amorphous state, and being able to be formed by a low-temperature process.

Techniques for supplying oxygen to oxide semiconductor layers of TFTs to reduce degradation of electrical characteristics have conventionally been disclosed. For example, PTL 1 discloses a technique for performing heat treatment on an oxide semiconductor layer after formation of the oxide semiconductor layer to supply oxygen to the oxide semiconductor layer.

CITATION LIST

Patent Literature

[PTL 1]
Japanese Unexamined Patent Application Publication No. 2007-311404

SUMMARY OF INVENTION

Technical Problem

With the above conventional techniques, only oxygen defects mainly at the surfaces of the oxide semiconductor layers can be corrected. This results in insufficient uniformity and reliability of the characteristics of thin-film transistor substrates.

The present disclosure provides a thin-film transistor substrate having excellent uniformity and reliability of characteristics, and a method of manufacturing the same.

Solution to Problem

To solve the above-described problem, a method of manufacturing a thin-film transistor substrate according to the present disclosure includes forming an oxide semiconductor layer above a substrate, forming a first oxide film on the oxide semiconductor layer, performing oxidation processing on the oxide semiconductor layer after formation of the first oxide film, and forming a second oxide film on the first oxide film after the oxidation processing.

A thin-film transistor substrate according to the present disclosure includes a substrate, an oxide semiconductor layer, a first oxide film, and a second oxide film, the oxide semiconductor layer, the first oxide film, and the second oxide film being sequentially laminated above the substrate. In concentration profiles of elements in a direction of lamination, a concentration profile of fluorine elements shows a peak in proximity to a boundary between the first oxide film and the second oxide film, a concentration profile of nitric oxide shows that a concentration in proximity to the boundary is higher than a concentration in proximity to a center of the second oxide film, and a concentration profile of hydrogen elements discontinuously changes in proximity to the boundary.

Advantageous Effects of Invention

The present disclosure provides a thin-film transistor substrate having excellent uniformity and reliability of characteristics, and a method of manufacturing the same.

DESCRIPTION OF EMBODIMENTS

Findings Forming Basis of Present Disclosure

Figure 1:
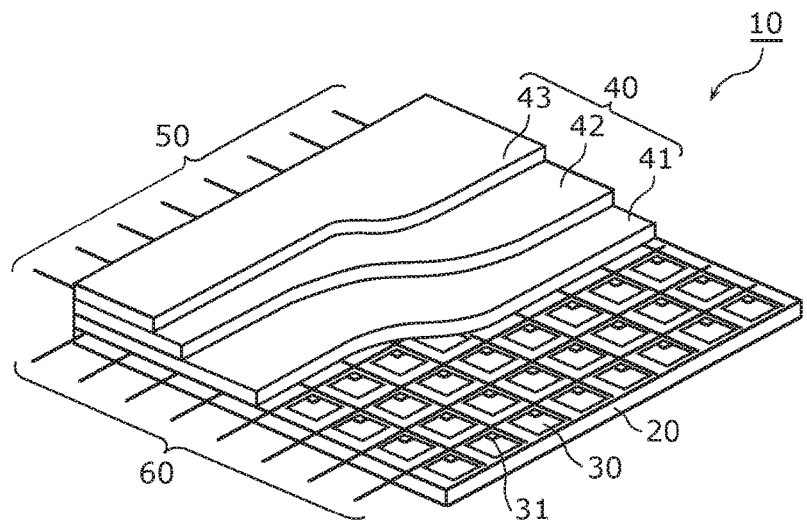
FIG. 1 is a cutaway perspective view of part of an organic EL display device according to an embodiment.

The inventors of the present disclosure have found the following problems with the conventional methods of manufacturing a thin-film transistor substrate described in the "Background Art."

Conventional thin-film transistor substrates have a channel protective layer (etching stopper layer) on an oxide semiconductor layer in order to protect the oxide semiconductor layer. To improve the reliability of the thin-film transistors, film deposition conditions for the channel protective layer are also important.

For example, bias-temperature-stress (BTS) characteristics is one of the characteristics that represent the reliability of a thin-film transistor including an oxide semiconductor. Increasing the film deposition temperature of the channel protective layer is effective in improving the BTS characteristics.

Conversely, the BTS characteristics degrade if the film deposition temperature of the channel protective layer is low.

For example, when a silicon oxide film is deposited as a channel protective layer by plasma chemical vapor deposition (CVD), a material gas is decomposed by plasma into a film precursor. In a low-temperature atmosphere, the energy of the plasma is low and there is insufficient energy for the film precursor to diffuse over the surface of the substrate.

As a result of insufficient diffusion of the film precursor over the surface, the film growth progresses without reaching a stable level of energy. Accordingly, a poor silicon oxide film with large numbers of defects and fixed charges is deposited. This increases the number of hole traps (trivalent Si+) in a region of the silicon oxide film in the vicinity of the interface between the silicon oxide film and the oxide semiconductor layer.

If, at this time, a positive bias is applied to the gate at high temperatures, holes generated by thermally excited oxygen defects are captured by trap levels in the silicon oxide film. This causes the interface on the silicon oxide film side to be positively charged. As a result, the electric field generated by a positive voltage at the gate is offset, and the threshold voltage $V_{th}$ of the thin-film transistor is shifted in a positive direction. Accordingly, positive BTS characteristics degrade.

If a negative bias is applied to the gate at high temperatures, holes generated by excited oxygen defects are trapped at the interface between the oxide semiconductor layer and a gate insulating layer. This creates a condition in which a positive voltage is always applied to the oxide semiconductor layer, thus causing the threshold voltage $V_{th}$ of the thin-film transistor to be shifted in a negative direction. Accordingly, negative BTS characteristics degrade.

From the foregoing, it is found that the reliability of the thin-film transistor decreases when the film deposition temperature of the channel protective layer is low.

Thus, increasing (not reducing) the film deposition temperature of the channel protective layer reduces the number of defects (oxygen defects) in the channel protective layer and the number of defects at the interface between the oxide semiconductor layer and the channel protective layer. Accordingly, it is possible to reduce the number of trap levels or the like that can be the cause of carrier scattering.

However, there is the problem that increasing the film deposition temperature of the channel protective layer accelerates desorption of oxygen from the oxide semiconductor layer during the film deposition of the channel protective layer. The desorption of oxygen increases the number of carriers in the oxide semiconductor layer and reduces the resistance of the oxide semiconductor layer.

For example, when the channel protective layer is deposited by plasma CVD, the plasma energy causes oxygen ions to separate as neutral oxygen from the oxide semiconductor layer. Then, electrons remaining in the defects generated by the separation of oxygen ions become carriers. In a higher temperature atmosphere, the plasma energy of the film deposition gas increases and therefore the amount of oxygen ions separated upon receiving the energy also increases.

Although some of the generated oxygen defects are corrected by executing heat treatment (annealing) after the film deposition of the channel protective layer, all oxygen defects are not completely corrected when a large number of oxygen defects have been generated. Also, the amount of oxygen defects that are corrected by annealing does not increase even if the annealing time is extended, because the amount of oxygen defects to be corrected is determined by the amount of interstitial oxygen in the oxide semiconductor layer and the amount of movable oxygen in the channel protective layer.

Thus, a region in which oxygen defects are not corrected includes a large number of carriers generated and becomes a low-resistance region. The low-resistance region causes a reduction in the threshold voltage $V_{th}$ of the thin-film transistor and causes, for example, deterioration in uniformity of the threshold voltage in a display panel. As a result, unevenness in display (unevenness in luminance) occurs in the display panel.

As described above, the uniformity and reliability of the characteristics cannot be increased by simply increasing the film deposition temperature of the channel protective layer.

In view of this, a method of manufacturing a thin-film transistor substrate according to the present disclosure includes a step of forming an oxide semiconductor layer above a substrate, a step of forming a first oxide film on the oxide semiconductor layer, a step of performing oxidation processing on the oxide semiconductor layer after formation of the first oxide film, and a step of forming a second oxide film on the first oxide film after the oxidation processing.

With this method, the number of defects in the oxide semiconductor layer and the number of defects at the interface between the first oxide film and the oxide semiconductor layer can be reduced. Thus, it is possible to reduce a low-resistance area of the thin-film transistor and increase the reliability of the thin-film transistor substrate.

Hereinafter, detailed description of embodiments will be given with reference to the drawings as appropriate. However, detailed description more than necessary may be omitted. For example, detailed description of well-known matter and redundant description of substantially identical constituent elements may be omitted. This is to avoid unnecessary redundancy of the following description and to facilitate the understanding for persons skilled in the art.

Note that the inventors provide the accompanying drawings and the following description to help persons skilled in the art to better understand the present disclosure, and do not intend to limit the subject matter of claims by these drawings and the description.

Note that the drawings are schematic diagrams and do not always strictly follow the actual configuration. In the drawings, constituent elements that are substantially identical are given the same reference numerals.

Embodiments

1. Organic EL Display Device

Figure 2:
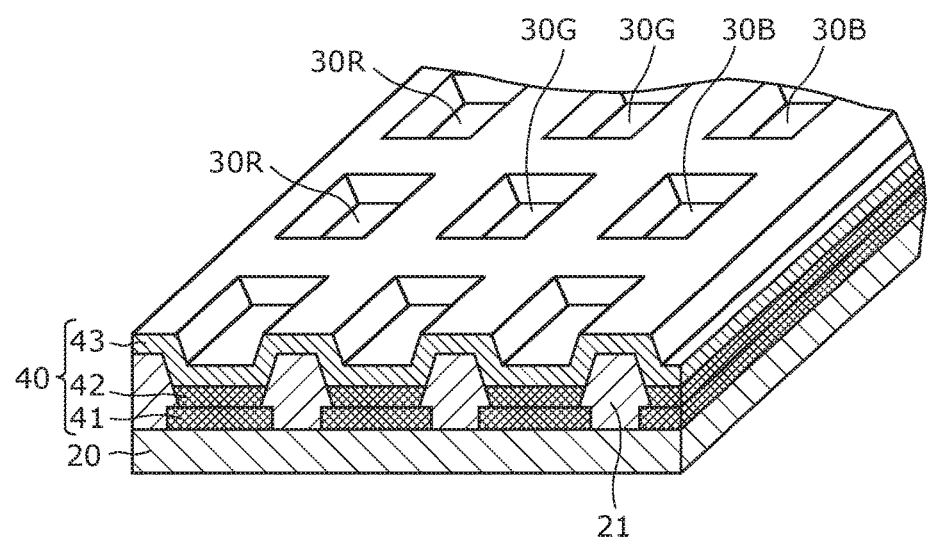
FIG. 2 is a perspective view illustrating an example of pixel banks of the organic EL display device according to the embodiment.

First, a configuration of an organic EL display device 10 according to an embodiment of the present disclosure will be described with reference to FIGS. 1 and 2. FIG. 1 is a cutaway perspective view of part of the organic EL display device 10 according to the embodiment. FIG. 2 is a perspective view illustrating an example of pixel banks of the organic EL display device 10 according to the embodiment.

1-1. Configuration

As illustrated in FIG. 1, the organic EL display device 10 has a laminated structure constituted by a TFT substrate (TFT array substrate) 20 on which a plurality of thin-film transistors are arranged, and organic EL elements (light emitting part) 40 that include an anode 41, an EL layer 42, and a cathode 43, the anode 41 being a lower electrode, the EL layer 42 being a light emitting layer made of an organic material, and the cathode 43 being a transparent upper electrode.

The TFT substrate 20 has a plurality of pixels 30 arranged in a matrix, each pixel 30 including a pixel circuit 31.

The organic EL elements 40 correspond respectively to the pixels 30, and the pixel circuit 31 of each pixel 30 controls light emission of each organic EL element 40. The organic EL elements 40 are formed on an interlayer insulator film (flattened layer) that is formed to cover a plurality of thin-film transistors.

The organic EL elements 40 are configured such that the EL layer 42 is arranged between the anode 41 and the cathode 43. A hole transfer layer is further laminated between the anode 41 and the EL layer 42, and an electron transfer layer is further laminated between the EL layer 42 and the cathode 43. Note that other organic functional layers may be provided between the anode 41 and the cathode 43.

Each pixel 30 is driven and controlled by the pixel circuit 31. The TFT substrate 20 also includes a plurality of gate interconnect lines (scanning lines) 50 that are arranged in a row direction of the pixels 30, a plurality of source interconnect lines (signal interconnect lines) 60 that are arranged in a column direction of the pixels 30 to intersect with the gate interconnect lines 50, and a plurality of power interconnect lines (not shown in FIG. 1) that are arranged in parallel with the source interconnect lines 60. For example, each pixel 30 is partitioned by gate interconnect lines 50 and source interconnect lines 60 that are orthogonal to each other.

The gate interconnect lines 50 are connected respectively to the rows of gate electrodes of thin-film transistors that are included in each pixel circuit 31 and operate as switching elements. The source interconnect lines 60 are connected respectively to the columns of source electrodes of the thin-film transistors that are included in each pixel circuit 31 and operate as switching elements. The power interconnect lines are connected respectively to the columns of drain electrodes of thin-film transistors that are included in each pixel circuit 31 and operate as driver elements.

As illustrated in FIG. 2, each pixel 30 of the organic EL display device 10 consists of three color (red, green, and blue) sub-pixels 30R, 30G, and 30B, and these sub-pixels 30R, 30G, and 30B are arranged in a plurality of matrices on the display surface. Each of the sub-pixels 30R, 30G, and 30B is separated by banks 21.

The banks 21 are formed in a lattice such that projections extending in parallel with the gate interconnect lines 50 intersect with projections extending in parallel with the source interconnect lines 60. Then, portions surrounded by these projections (i.e., openings of the banks 21) are in one-to-one correspondence with the sub-pixels 30R, 30G, and 30B. While the banks 21 in the embodiment are pixel banks, the banks 21 may be line banks.

The anode 41 is formed on the interlayer insulator film (flattened layer) of the TFT substrate 20 and within an opening of the banks 21 for each of the sub-pixels 30R, 30G, and 30B. Similarly, the EL layer 42 is formed on the anode 41 and within an opening of the banks 21 for each of the sub-pixel 30R, 30G, and 30B. The transparent cathode 43 is continuously formed on the plurality of banks 21 to cover all of the EL layers 42 (all of the sub-pixels 30R, 30G, and 30B).

The pixel circuit 31 is provided for each of the sub-pixels 30R, 30G, and 30B, and each of the sub-pixels 30R, 30G, and 30B and the corresponding pixel circuit 31 are electrically connected to each other via a contact hole and a relay electrode. Note that the sub-pixels 30R, 30G, and 30B have identical structures, except that the EL layers 42 emit different colors of light.

1-2. Pixel Circuit

Figure 3:
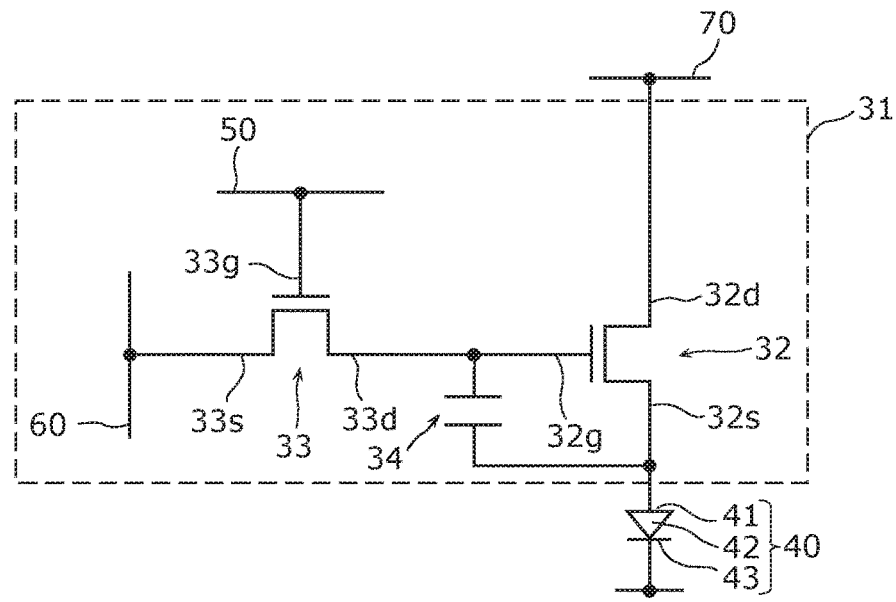
FIG. 3 is an electric circuit diagram illustrating a structure of a pixel circuit in the organic EL display device according to the embodiment.

Here, the circuit structure of the pixel circuits 31 of the pixels 30 will be described with reference to FIG. 3. FIG. 3 is an electric circuit diagram illustrating the structure of a pixel circuit 31 in the organic EL display device 10 according to the embodiment.

As illustrated in FIG. 3, the pixel circuit 31 includes a thin-film transistor 32 that operates as a driver element, a thin-film transistor 33 that operates as a switching element, and a capacitor 34 that stores data to be displayed on the corresponding pixel 30. In the embodiment, the thin-film transistor 32 is a driver transistor for driving the organic EL element 40, and the thin-film transistor 33 is a switching transistor for selecting the pixel 30.

The thin-film transistor 32 includes a gate electrode 32g that is connected to a drain electrode 33d of the thin-film transistor 33 and one end of the capacitor 34, a drain electrode 32d that is connected to a power interconnect line 70, a source electrode 32s that is connected to the other end of the capacitor 34 and the anode 41 of an organic EL element 40, and a semiconductor film (not shown). The thin-film transistor 32 supplies a current that corresponds to a data voltage stored in the capacitor 34 from the power interconnect line 70 via the source electrode 32s to the anode 41 of the organic EL element 40. As a result, the driving current flows from the anode 41 to the cathode 43, and the EL layer emits light in the organic EL element 40.

The thin-film transistor 33 includes a gate electrode 33g that is connected to a gate interconnect line 50, a source electrode 33s that is connected to a source interconnect line 60, the drain electrode 33d that is connected to one end of the capacitor 34 and the gate electrode 32g of the thin-film transistor 32, and a semiconductor film (not shown). In the thin-film transistor 33, when a predetermined voltage is applied to the connected gate interconnect line 50 and the connected source interconnect line 60, the voltage applied to the source interconnect line 60 is stored as a data voltage in the capacitor 34.

Note that the organic EL display device 10 with the above-described configuration adopts an active matrix method in which display control is performed for each pixel 30 located at the intersection of a gate interconnect line 50 and a source interconnect line 60. Thus, a desired image is displayed by the thin-film transistors 32 and 33 of each pixel 30 (sub-pixels 30R, 30G, and 30B) causing the corresponding organic EL element 40 to selectively emit light.

2. TFT Substrate

Hereinafter, the TFT substrate 20 according to the embodiment will be described with reference to FIG. 4. Note that the thin-film transistors on the TFT substrate 20 according to the embodiment are bottom-gate type and channel protection type thin-film transistors.

Figure 4:
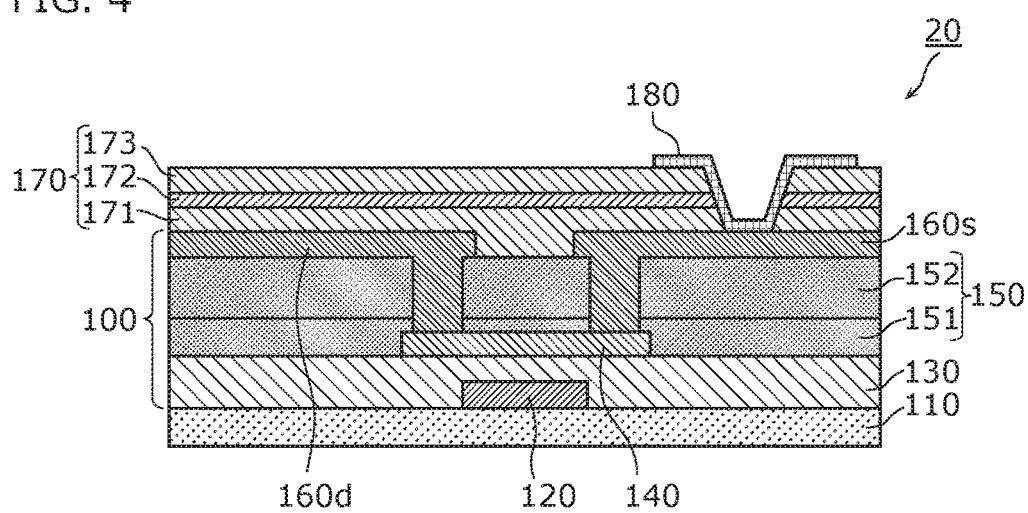
FIG. 4 is a schematic cross-sectional view illustrating an example of a thin-film transistor substrate according to the embodiment.

FIG. 4 is a schematic cross-sectional view of the TFT substrate 20 according to the embodiment. For example, the TFT substrate 20 has a plurality of thin-film transistors 100.

As illustrated in FIG. 4, the TFT substrate 20 according to the embodiment includes a substrate 110, a gate electrode 120, a gate insulating layer 130, an oxide semiconductor layer 140, a channel protective layer 150, a drain electrode 160d, a source electrode 160s, an interlayer insulating layer 170, and an upper electrode 180. Note that a thin-film transistor 100 on the TFT substrate 20 is constituted by the gate electrode 120, the gate insulating layer 130, the oxide semiconductor layer 140, the channel protective layer 150, the drain electrode 160d, and the source electrode 160s.

The thin-film transistor 100 may, for example, be the thin-film transistor 33 illustrated in FIG. 3. That is, the thin-film transistor 100 may be used as a driver transistor. More specifically, when the thin-film transistor 100 is the thin-film transistor 32 (driver transistor), the gate electrode 120, the source electrode 160s, and the drain electrode 160d correspond respectively to the gate electrode 32g, the source electrode 32s, and the drain electrode 32d.

The thin-film transistor 100 may, for example, be the thin-film transistor 33 illustrated in FIG. 3. That is, the thin-film transistor 100 may be used as a switching transistor.

2-1. Substrate

The substrate 110 is made of a material having electrical insulating properties. For example, the substrate 110 may be made of a glass material such as no alkali glass, silica glass, or high heat-resistant glass; a resin material such as polyethylene, polypropylene, or polyimide; a semiconductor material such as silicon or gallium arsenide; or a metallic material such as stainless steel coated with an insulating layer.

The substrate 110 may be a flexible substrate such as a resin substrate. In this case, the thin-film transistor 100 is usable in flexible displays.

2-2. Gate Electrode

The gate electrode 120 is formed in a predetermined shape on the substrate 110. The gate electrode 120 has a film thickness of, for example, 20 nm to 300 nm. The gate electrode 120 may be formed above the substrate 110, for example, via a buffer layer.

The gate electrode 120 is an electrode made of a material having electrical conductivity. Examples of the material for the gate electrode 120 include metals such as molybdenum, aluminum, copper, tungsten, titanium, manganese, chromium, tantalum, niobium, silver, gold, platinum, palladium, indium, nickel, and neodymium; alloys of metals; conductive metallic oxides such as indium tin oxide (ITO), aluminum-doped zinc oxide (AZO), and gallium-doped zinc oxide (GZO); and conductive polymers such as polythiophene or polyacethylene. Alternatively, the gate electrode 120 may have a multilayer structure configured by laminating these materials.

2-3. Gate Insulating Layer

The gate insulating layer 130 is formed between the gate electrode 120 and the semiconductor layer 140. More specifically, the gate insulating layer 130 is formed on the gate electrode 120 and on the substrate 110 to cover the gate electrode 120. The gate insulating layer 130 has a film thickness of, for example, 50 nm to 500 nm.

The gate insulating layer 130 is made of a material having electrical insulating properties. For example, the gate insulating layer 130 may be a single-layer film such as a silicon oxide film, a silicon nitride film, a silicon oxynitride film, an aluminum oxide film, a tantalum oxide film, or a hafnium oxide film; or a laminated film of these single-layer films.

2-4. Oxide Semiconductor Layer

The oxide semiconductor layer 140 is formed above the substrate 110 to face the gate electrode 120. More specifically, the oxide semiconductor layer 140 is formed at a position facing the gate electrode 120 on the gate insulating layer 130. For example, the oxide semiconductor layer 140 is formed above the gate electrode 120 and in an island shape on the gate insulating layer 130. The oxide semiconductor layer 140 has a film thickness of, for example, 30 nm to 150 nm.

The material for the oxide semiconductor layer 140 may be an oxide semiconductor material that contains at least one of indium (In), gallium (Ga), and zinc (Zn). For example, the oxide semiconductor layer 140 may be made of a transparent amorphous oxide semiconductor (TAOS) such as amorphous indium gallium zinc oxide (InGaZnO:IGZO).

The ratio of In, Ga, and Zn may, for example, be approximately 1:1:1. The ratio of In, Ga, and Zn may be in the range of 0.8-1.2:0.8-1.2:0.8-1.2, but is not limited to this range.

The oxide semiconductor layer 140 is a channel layer of the thin-film transistor 100. The thin-film transistor including a transparent amorphous oxide semiconductor as the channel layer exhibits high carrier mobility and is suitable for large-screen, high-definition display devices. The transparent amorphous oxide semiconductor can be deposited at low temperatures and thus can be easily formed on flexible substrates such as plastics or films.

2-5. Channel Protective Layer

The channel protective layer 150 is formed on the oxide semiconductor layer 140. For example, the channel protective layer 150 is formed on the semiconductor layer 140 and on the gate insulating layer 130 to cover the semiconductor layer 140. The channel protective layer 150 is an insulating layer provided to protect the oxide semiconductor layer 140. The channel protective layer 150 has a film thickness of, for example, 50 nm to 500 nm.

The channel protective layer 150 includes a plurality of layers. More specifically, the channel protective layer 150 has a two-layer structure as illustrated in FIG. 4 and includes a first oxide film 151 and a second oxide film 152 that are sequentially laminated one above the other.

2-5-1. First Oxide Film

The first oxide film 151 is an insulator film provided on the oxide semiconductor layer 140. For example, the first oxide film 151 is a silicon oxide film. Alternatively, the first oxide film 151 may be an aluminum oxide film. The first oxide film 151 has a film thickness of, for example, 5 nm to 40 nm.

2-5-2. Second Oxide Film

The second oxide film 152 is an insulator film provided on the first oxide film 151. For example, the second oxide film 152 is a silicon oxide film. Alternatively, the second oxide film 152 may be an aluminum oxide film. The second oxide film 152 has, for example, a thickness that makes the channel protective layer 150 have a film thickness of 500 nm or less. That is, the second oxide film 152 has such a film thickness that makes a total of the film thicknesses of the first oxide film 151 and the second oxide film 152 become 500 nm or less.

Note that the first oxide film 151 and the second oxide film 152 may be made of the same material or may be made of different materials.

The first oxide film 151 and the second oxide film 152 have contact holes for connecting the drain electrode 160d and the source electrode 160s to the oxide semiconductor layer 140. The material(s) for the drain electrode 160d and the source electrode 160s reaches the oxide semiconductor layer 140 along the wall surfaces of the contact holes. Alternatively, the contact holes may be filled with the material(s) for the drain electrode 160d and the source electrode 160s.

2-6. Drain Electrode and Source Electrode

The drain electrode 160d and the source electrode 160s are formed in predetermined shapes on the channel protective layer 150. For example, the drain electrode 160d and the source electrode 160s are arranged spaced from and facing each other in a horizontal direction of the substrate on the channel protective layer 150. More specifically, the drain electrode 160d and the source electrode 160s are formed on the channel protective layer 150 so as to be connected to the oxide semiconductor layer 140 through the contact holes. The drain electrode 160d and the source electrode 160s have film thicknesses of, for example, 100 nm to 500 nm.

The drain electrode 160d and the source electrode 160s are electrodes made of a material having electrical conductivity. For example, the drain electrode 160d and the source electrode 160s may be a single-layer film of copper (Cu film), or may have a laminated structure (Cu/W) of a copper film and a tungsten film, a laminated structure (Cu/TiN) of a copper film and a titanium nitride film, or a laminated structure (CuMn/Cu/Mo) of an alloy film of copper and manganese, a copper film, and a molybdenum film. Alternatively, the drain electrode 160d and the source electrode 160s may be made of the same material as the material for the gate electrode 120.

2-7. Interlayer Insulating Layer

The interlayer insulating layer 170 is formed above the channel protective layer 150. The interlayer insulating layer 170 is formed on the channel protective layer 150, the drain electrode 160d, and the source electrode 160s. For example, the interlayer insulating layer 170 is formed on the channel protective layer 150 and on the drain electrode 160d and the source electrode 160s to cover the drain electrode 160d and the source electrode 160s.

The interlayer insulating layer 170 is a passivation film of the thin-film transistor 100. The interlayer insulating layer 170 has a film thickness of, for example, 200 nm to 500 nm.

Part of the interlayer insulating layer 170 has an opening that penetrates through the interlayer insulating layer. That is, the interlayer insulating layer 170 has a contact hole 170 for exposing part of the source electrode 160s.

The contact hole is for electrically connecting the upper electrode 180 and the source electrode 160s. For example, the material for the upper electrode 180 reaches the source electrode 160s along the wall surface of the contact hole. Alternatively, the contact hole may be filled with the material for the upper electrode 180.

The interlayer insulating layer 170 includes a plurality of layers. More specifically, the interlayer insulating layer 170 has a three-layer structure as illustrated in FIG. 4 and includes a lower interlayer insulating layer 171, a barrier layer 172, and an upper interlayer insulating layer 173 that are sequentially laminated one above another.

2-7-1. Lower Interlayer Insulating Layer

The lower interlayer insulating layer 171 is an insulator film provided on the drain electrode 160d and the source electrode 160s. The lower interlayer insulating layer 171 has a film thickness that makes the interlayer insulating layer 170 have a film thickness of 500 nm or less.

The lower interlayer insulating layer 171 is made of a material having electrical insulating properties. For example, the lower interlayer insulating layer 171 may be a film made of an inorganic material such as a silicon oxide film, a silicon nitride film, a silicon oxynitride film, or an aluminum oxide film; a single-layer film such as a film made of an inorganic material that contains silicon, oxygen, and carbon; or a laminated film of these films.

2-7-2. Barrier Layer

The barrier layer 172 is an insulator film provided on the lower interlayer insulating layer 171. The barrier layer 172 is a layer for suppressing, for example, moisture in the air entering the oxide semiconductor layer 140 from the outside.

The barrier layer 172 is, for example, an alumina film. The barrier layer 172 has a film thickness of, for example, 30 nm to 100 nm.

2-7-3. Upper Interlayer Insulating Layer

The upper interlayer insulating layer 173 is an insulator film provided on the barrier layer 172. The upper interlayer insulating layer 173 has a film thickness that makes the interlayer insulating layer 170 have a film thickness of 500 nm or less.

The upper interlayer insulating layer 173 is made of a material having electrical insulating properties. For example, the upper interlayer insulating layer 173 is made of the same material as the lower interlayer insulating layer 171.

2-8. Upper Electrode

The upper electrode 180 is formed in a predetermined shape above the drain electrode 160d and the source electrode 160s. More specifically, the upper electrode 180 is formed on the interlayer insulating layer 170. The upper electrode 180 has a film thickness of, for example, 200 nm to 500 nm.

The upper electrode 180 is connected to one of the drain electrode 160d and the source electrode 160s. More specifically, the upper electrode 180 is electrically connected to the source electrode 160s through the contact hole.

The upper electrode 180 is made of, for example, the same material as the drain electrode 160d and the source electrode 160s. To improve interlayer adhesion properties, an ITO film and a metal film may be laminated in this order.

3. Method of Manufacturing TFT Substrate

Figure 5A:
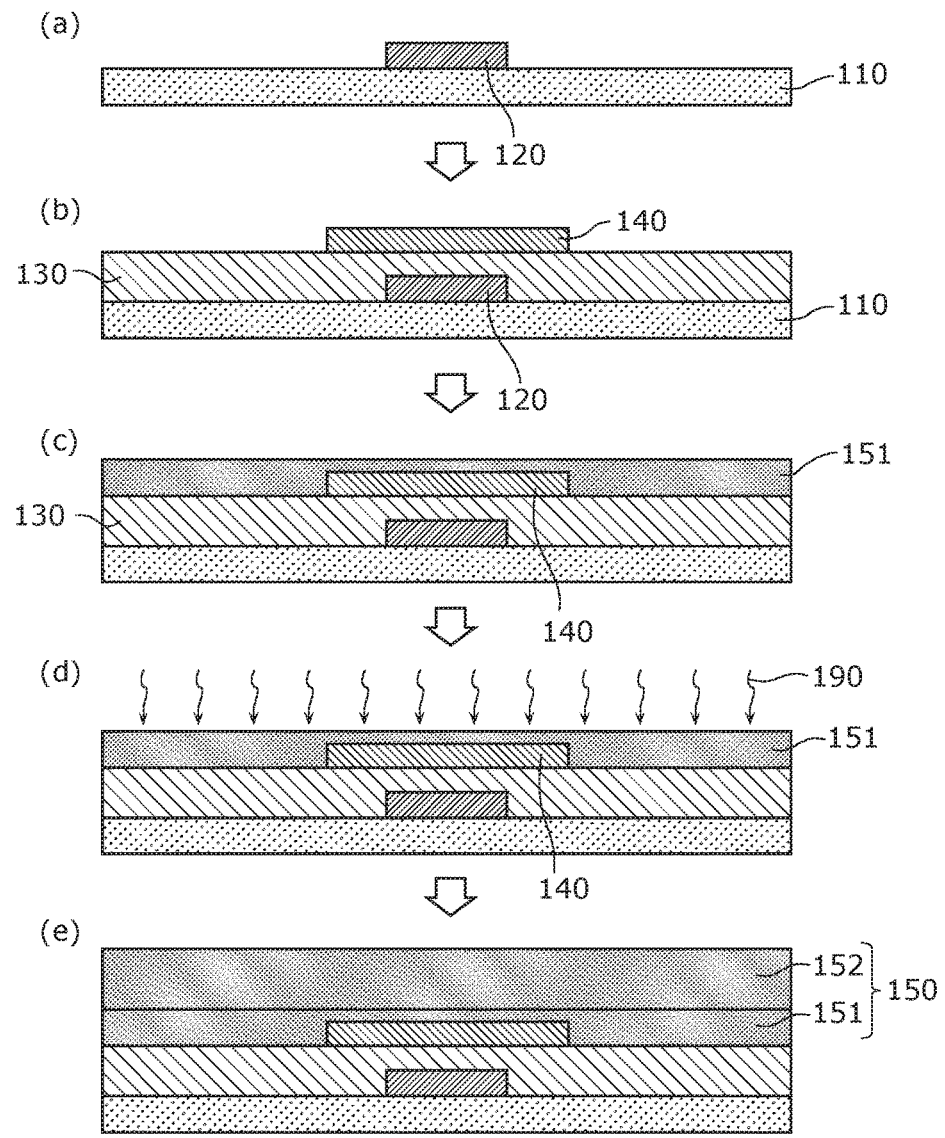
FIG. 5A is a schematic cross-sectional view illustrating steps of manufacturing the thin-film transistor substrate according to the embodiment.
Figure 5B:
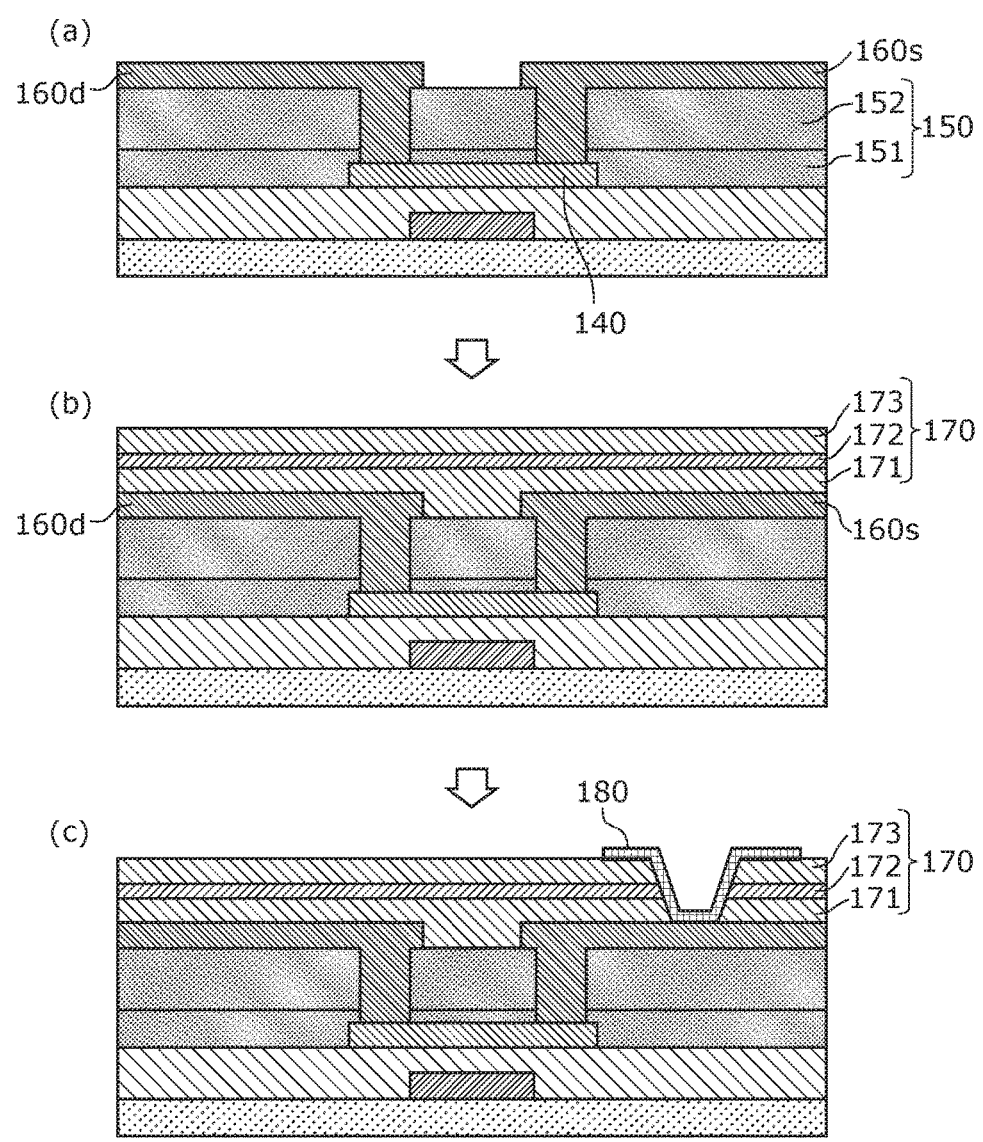
FIG. 5B is a schematic cross-sectional view illustrating steps of manufacturing the thin-film transistor substrate according to the embodiment.

Next, a method of manufacturing the TFT substrate 20 according to the embodiment will be described with reference to FIGS. 5A and 5B. FIGS. 5A and 5B are schematic cross-sectional views illustrating steps of manufacturing the TFT substrate 20 according to the embodiment.

3-1. Formation of Gate Electrode

First, as illustrated in (a) in FIG. 5A, the substrate 110 is prepared and the gate electrode 120 having a predetermined shape is formed above the substrate 110. For example, a metal film is deposited on the substrate 110 by sputtering and processed by photolithography and etching to form the gate electrode 120 of a predetermined shape.

More specifically, first, a glass substrate is prepared as the substrate 110, and a 20-nm Mo film and a 200-nm Cu film are sequentially deposited on the substrate 110 by sputtering. Then, the Mo film and the Cu film are patterned by photolithography and wet etching to form the gate electrode 120.

The wet etching of the Mo film and the Cu film may use, for example, a chemical solution obtained by mixing a hydrogen peroxide solution ($H_2O_2$) and organic acid. The substrate 110 is, for example, a G8.5 glass substrate (0.5 mm thick, X: 2500 mm×Y: 2200 mm).

3-2. Formation of Gate Insulating Layer

Next, the gate insulating layer 130 is formed above the substrate 110 as illustrated in (b) in FIG. 5A. For example, the gate insulating layer 130 is deposited by plasma CVD or sputtering to cover the gate electrode 120.

More specifically, a 220-nm silicon nitride film and a 50-nm silicon oxide film are sequentially deposited on the substrate 110 by plasma CVD to cover the gate electrode 120, thereby forming the gate insulating layer 130. The film deposition temperature at this time is, for example, in the range of 350° C. to 400° C.

The silicon nitride film may be deposited using, for example, a silane gas ($SiH_4$), an ammonia gas ($NH_3$), and a nitrogen gas ($N_2$) as introduction gases. The silicon oxide film may be deposited using, for example, a silane gas ($SiH_4$) and a nitrous oxide gas ($N_2O$) as introduction gases.

3-3. Formation of Oxide Semiconductor Layer

Next, the oxide semiconductor layer 140 having a predetermined shape is formed at a position facing the gate electrode 120 above the substrate 110. For example, an oxide semiconductor film is deposited on the gate insulating layer 130 by sputtering. The oxide semiconductor film is then processed by photolithography and etching to form the oxide semiconductor layer 140 of a predetermined shape.

More specifically, a 90-nm amorphous InGaZnO film is deposited on the gate insulating layer 130 by sputtering that is performed in a mixed gas atmosphere of oxygen ($O_2$) and argon (Ar), using a target material in which the composition ratio of In, Ga, and Zn is 1:1:1. More specific film deposition conditions in, for example, DC magnetron sputtering are that the power is 12 kW, the oxygen partial pressure in the film deposition gas is 4.5%, and the film deposition rate is 100 nm/min.

Then, the amorphous InGaZnO film deposited on the gate insulating layer 130 is wet etched to form the oxide semiconductor layer 140. The wet etching of InGaZnO may be performed using, for example, a chemical solution obtained by mixing phosphoric acid ($H_3PO_4$), nitric acid ($HNO_3$), acetic acid ($CH_3COOH$), and water.

3-4. Formation of First Oxide Film

Next, the first oxide film 151 is formed on the oxide semiconductor layer 140 as illustrated in (c) in FIG. 5A. For example, the first oxide film 151 is deposited by plasma CVD to cover the oxide semiconductor layer 140.

More specifically, the first oxide film 151 is formed by depositing a silicon oxide film with a thickness of 5 nm to 40 nm on the gate insulating layer 130 to cover the oxide semiconductor layer 140. The film deposition temperature at this time is, for example, in the range of 260° C. to 290° C.

The silicon oxide film may be deposited using, for example, a silane gas (SiH$_4$) and a nitrous oxide gas (N$_2$O) as introduction gases.

3-5. Plasma Treatment

Next, plasma treatment is performed as illustrated in (d) in FIG. 5A, which is one example of oxidation processing that is performed on the oxide semiconductor layer 140. That is, plasma treatment is performed after the formation of the first oxide film 151 and before the formation of the second oxide film 152.

More specifically, plasma 190 is generated using a nitrous oxide gas (N$_2$O) within the chamber that is used for the film deposition of the first oxide film 151. The time required to generate the plasma 190, i.e., plasma treatment time, is in the range of, for example, 60 seconds to 180 seconds. A plasma treatment temperature, i.e., substrate temperature, is in the range of 260° C. to 350° C. The substrate temperature is, for example, the same as the substrate temperature during the film deposition of the first oxide film 151.

3-6. Formation of Second Oxide Film

Next, the second oxide film 152 is formed on the first oxide film 151 as illustrated in (e) in FIG. 5A. For example, a silicon oxide film with a film thickness of approximately 200 nm is deposited on the first oxide film 151 to form the second oxide film 152. The film deposition temperature at this time is, for example, in the range of 260° C. to 350° C. For example, conditions such as the film deposition temperature and the introduction gases are the same as those in the case of depositing the first oxide film 151.

In this way, the formation of the first oxide film 151, the plasma treatment, and the formation of the second oxide film 152 can be performed within the same chamber. The substrate temperature may also remain unchanged throughout these steps. This simplifies the process steps and reduces cost.

Note that the details of process conditions for the step of depositing the first oxide film 151, the step of plasma treatment, and the step of depositing the second oxide film 152 will be described later. Alternatively, heat treatment (annealing) may be performed at a predetermined temperature after the formation of the second oxide film 152.

3-7. Formation of Drain Electrode and Source Electrode

Next, the drain electrode 160d and the source electrode 160s are formed on the second oxide film 152 (channel protective layer 150) as illustrated in (a) in FIG. 5B. More specifically, first, part of the channel protective layer 150 is removed by etching to form contact holes. That is, contact holes for exposing part of the oxide semiconductor layer 140 are formed in the channel protective layer 150.

For example, when the first oxide film 151 and the second oxide film 152 are silicon oxide films, reactive ion etching (RIE) may be used as dry etching. At this time, for example, carbon tetrafluoride (CF$_4$) and an oxygen gas (O$_2$) may be used as an etching gas. Parameters such as gas flow rate, pressure, applied electric power, and frequency are appropriately set according to, for example, substrate size and film thickness that is etched.

Then, a metal film is deposited on the channel protective layer 150 by sputtering to fill in the formed contact holes. For example, a 20-nm Mo film, a 300-nm Cu film, and a 20-nm alloy film (CuMn film) of copper and manganese are sequentially laminated on the channel protective layer 150. Thereafter, the laminated metal film is processed by photolithography and etching to form the drain electrode 160d and the source electrode 160s of predetermined shapes. The wet etching of the Mo film, the Cu film, and the CuMn film may be performed using, for example, a chemical solution obtained by mixing a hydrogen peroxide solution (H$_2$O$_2$) and organic acid.

3-8. Formation of Interlayer Insulating Layer

Next, the interlayer insulating layer 170 is formed as illustrated in (b) in FIG. 5B. More specifically, first, the lower interlayer insulating layer 171 is formed by plasma CVD or sputtering to cover the drain electrode 160d and the source electrode 160s. For example, a 100-nm silicon oxide film is deposited on the channel protective layer 150 by plasma CVD to cover the drain electrode 160d and the source electrode 160s.

Next, the barrier layer 172 is formed on the lower interlayer insulating layer 171 by plasma CVD, atomic layer deposition (ALD), or sputtering. For example, a 25-nm aluminum oxide film is deposited on the lower interlayer insulating layer 171 by sputtering to form the barrier layer 172. More specifically, an aluminum oxide film is deposited by sputtering using aluminum as a target in a mixed gas atmosphere of oxygen (O$_2$) and argon (Ar).

Next, the upper interlayer insulating layer 173 is formed on the barrier layer 172 by plasma CVD or sputtering. More specifically, a 400-nm silicon nitride film is deposited on the barrier layer 172 by plasma CVD to form the upper interlayer insulating layer 173.

Because the substrate is placed under vacuum during the film deposition of the interlayer insulating layer 170, the oxide semiconductor layer 140 suffers lack of oxygen and hence has reduced resistance. Thus, dry airing after film deposition or annealing in an oxygen atmosphere is performed to correct oxygen defects.

3-9. Formation of Upper Electrode

Next, the upper electrode 180 is formed on the interlayer insulating layer 170 (upper interlayer insulating layer 173) as illustrated in (c) in FIG. 5B. More specifically, first, part of the interlayer insulating layer 170 is removed by etching to form a contact hole. That is, the contact hole for exposing part of the drain electrode 160d or the source electrode 160s is formed in the interlayer insulating layer 170.

For example, first, part of the upper interlayer insulating layer 173 is removed by dry etching such as RIE. For example, carbon tetrafluoride (CF$_4$) and an oxygen gas (O$_2$) may be used as an etching gas. Parameters such as gas flow rate, pressure, applied electric power, and frequency are appropriately set according to, for example, substrate size and film thickness that is etched.

Next, part of the barrier layer 172 is removed by, for example, wet etching using an alkaline solution. The wet etching of the aluminum oxide film may use, for example, a potassium hydroxide (KOH) solution.

Then, part of the lower interlayer insulating layer 171 is removed by, for example, dry etching such as RIE. For example, carbon tetrafluoride (CF$_4$) and an oxygen gas (O$_2$) may be used as an etching gas. Parameters such as gas flow rate, pressure, applied electric power, and frequency are appropriately set according to, for example, substrate size and film thickness that is etched.

Following this, a conductive film is deposited on the interlayer insulating layer 170 by sputtering to fill in the formed contact hole. For example, a 70-nm ITO film, a 300-nm Cu film, and a 20-nm CuMn film are sequentially laminated on the interlayer insulating layer 170. Thereafter, the laminated conductive films are processed by photolithography and etching to form the upper electrode 180 of a predetermined shape. The wet etching of the Cu film and the CuMn film may use, for example, a chemical solution obtained by mixing a hydrogen peroxide solution ($H_2O_2$) and organic acid. The wet etching of the ITO film may use, for example, an oxalic-acid-based chemical solution.

Through the steps described above, the TFT substrate 20 illustrated in FIG. 4 is manufactured. Note that other layers such as the organic EL elements 40 are further laminated in subsequent steps.

4. Process Conditions and Carrier Lifetime

Next, the result of measuring the carrier lifetime (lifetime) in the oxide semiconductor will be described in order to determine suitable process conditions for the TFT substrate 20 according to the embodiment. More specifically, samples that include an oxide semiconductor layer were prepared to measure the carrier lifetime using microwave photo conductivity decay (μ-PCD) method.

In the μ-PCD method, first, microwaves (26 GHz) were applied to the samples to measure reflection intensity A (base intensity) of microwaves reflected by the samples.

Next, an ultraviolet pulse laser was applied to the samples at the same time as microwaves (26 GHz) were applied to the samples. More specifically, a YLF-3GH laser (λ=349 nm, pulse time width=15 nsec) was used for the application of the ultraviolet pulse laser. At this time, reflection intensity B of microwaves reflected by the samples was measured.

Figure 6:
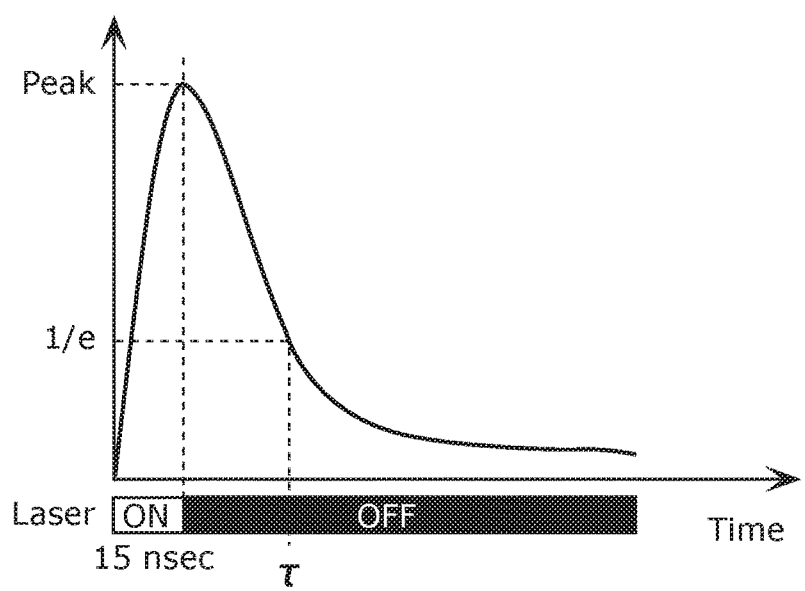
FIG. 6 illustrates reflection intensity of microwaves applied to measure carrier lifetime in an oxide semiconductor layer.

A temporal change curve illustrated in FIG. 6 shows the value obtained by subtracting the reflection intensity A from the reflection intensity B. Here, FIG. 6 illustrates the reflection intensity of microwaves applied to measure the carrier lifetime in the oxide semiconductor layer.

As illustrated in FIG. 6, the reflection intensity increases and then decreases. In the temporal change curve illustrated in FIG. 6, an attenuation constant (time required for the reflection intensity to change from the peak to 1/e) is defined as carrier lifetime τ.

A long carrier lifetime τ indicates small numbers of trap levels and recombination centers within a bulk of the oxide semiconductor and at the interface between the oxide semiconductor and the insulator film. That is, as the carrier lifetime τ increases, there are smaller numbers of defects in the bulk and at the interface, and therefore a reduction in the resistance of the oxide semiconductor layer is suppressed.

4-1. Sample Structure

Figure 7A:
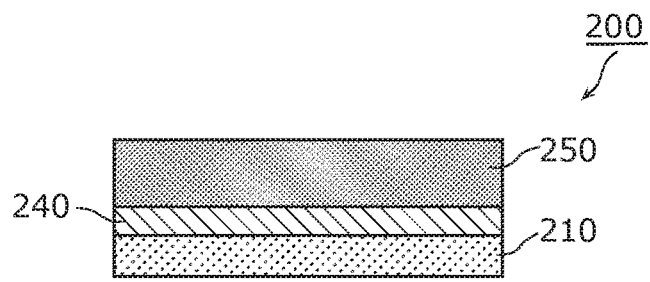
FIG. 7A is a schematic cross-sectional view illustrating the structure of a sample that is prepared to determine suitable process conditions for the thin-film transistor substrate according to the embodiment.
Figure 7B:
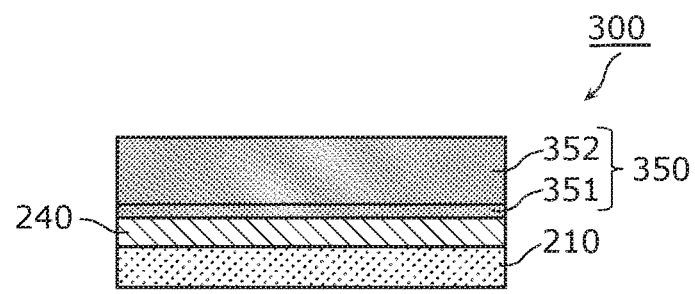
FIG. 7B is a schematic cross-sectional view illustrating the structure of another sample that is prepared to determine suitable process conditions for the thin-film transistor substrate according to the embodiment.

The structures of the samples used to measure the carrier lifetime will now be described with reference to FIGS. 7A and 7B. FIGS. 7A and 7B are respectively schematic cross-sectional views illustrating the structures of samples 200 and 300 prepared to determine suitable process conditions for the TFT substrate 20 according to the embodiment.

The sample 200 illustrated in FIG. 7A is created as a comparative example of the sample 300 illustrated in FIG. 7B. More specifically, the sample 200 includes a single-layer insulating layer 250 on an oxide semiconductor layer 240. On the other hand, the sample 300 illustrated in FIG. 7B includes an insulating layer 350 having a two-layer structure on the oxide semiconductor layer 240, like the TFT substrate 20 according to the embodiment illustrated in FIG. 4.

4-1-1. Sample (Single-Layer Protective Film)

As illustrated in FIG. 7A, the sample 200 includes a substrate 210, the oxide semiconductor layer 240, and the insulating layer 250.

The substrate 210 is a G8.5 glass substrate (8.5 mm thick, X: 2500 mm×Y: 2200 mm). The sample 200 is prepared by sequentially depositing the oxide semiconductor layer 240 and the insulating layer 250 on the substrate 210.

The oxide semiconductor layer 240 is made of amorphous indium gallium zinc oxide having a film thickness of 90 nm and deposited by DC magnetron sputtering. Specific film deposition conditions are that the power is 12 kW, the composition ratio of In, Ga, and Zn of the target is 1:1:1, the film deposition gas is a mixed gas (oxygen partial pressure of 4.5%) of oxygen ($O_2$) and argon (Ar), and the film deposition rate is 100 nm/min. These conditions may be referred to as "TAOS film-deposition conditions" in the following description.

The insulating layer 250 is a silicon oxide film having a film thickness of 200 nm and deposited by plasma CVD (parallel-plate plasma CVD). Specific film deposition conditions are that the power density is 0.238 W/cm$^2$, the process distance (interelectrode distance) is 600 mil (0.6 inches), the process pressure is 133.32 Pa, the $N_2O$ gas is at 88500 sccm, and the $SiH_4$ gas is at 980 sccm. These conditions may be referred to as "single-layer SiO film deposition conditions" in the following description.

For the sample 200, after the film deposition of the insulating layer 250, heat treatment (annealing) was performed at 350° C. for one hour in a dry air atmosphere (dew point under atmospheric pressure was −70° C. or less).

4-1-2. Sample (Two-Layer Protective Film)

As illustrated in FIG. 7B, the sample 300 includes the substrate 210, the oxide semiconductor layer 240, and the insulating layer 350. The insulating layer 350 includes a first oxide film 351 and a second oxide film 352. The materials and film deposition conditions for the substrate 210 and the oxide semiconductor layer 240 are the same as the material and film deposition conditions for the sample 200, and therefore description thereof is omitted.

The first oxide film 351 is a silicon oxide film having a film thickness of 20 nm and deposited by plasma CVD (parallel-plate plasma CVD). Specific film deposition conditions are that the power density is 0.238 W/cm$^2$, the process distance (interelectrode distance) is 600 mil (0.6 inches), the process pressure is 133.32 Pa, the $N_2O$ gas is at 88500 sccm, and the $SiH_4$ gas is at 980 sccm. These conditions may be referred to as "ES1-SiO film deposition conditions" in the following description.

For the sample 300, $N_2O$ plasma treatment was performed after the film deposition of the first oxide film 351. Specific plasma treatment conditions are that the power density is 0.182 W/cm$^2$, the process distance is 750 mil, the process pressure is 93.32 Pa, the $N_2O$ gas is at 30000 sccm, and the $SiH_4$ gas is at 0 sccm. The substrate temperature during the plasma treatment is the same as the substrate temperature during the film deposition of the first oxide film 351. These conditions may be referred to as "$N_2O$ plasma treatment conditions" in the following description.

The second oxide film 352 is a silicon oxide film having a film thickness of 180 nm and deposited by plasma CVD (parallel-plate plasma CVD) after the $N_2O$ plasma treatment. Specific film deposition conditions are the same as the film deposition conditions for the first oxide film 351. These conditions may be referred to as "ES2-SiO film deposition conditions" in the following description.

For the sample 300, after the film deposition of the second oxide film 352, heat treatment (annealing) was performed at 350° C. for one hour in a dry air atmosphere (dew point under atmospheric pressure was −70° C. or less).

4-2. Measurement Result for Sample (Single-Layer Structure)

Here is a description of the result of measuring the carrier lifetime using μ-PCD method for the sample 200 according to the comparative example, while changing the film deposition temperature of the insulating layer 250 (substrate temperature during the film deposition). Note that the number of measurement points of the carrier lifetime was 207, and the measurement was conducted at approximately 110-mm intervals in the X direction (lateral direction) and at approximately 150-mm intervals in the Y direction (longitudinal direction).

Figure 8:
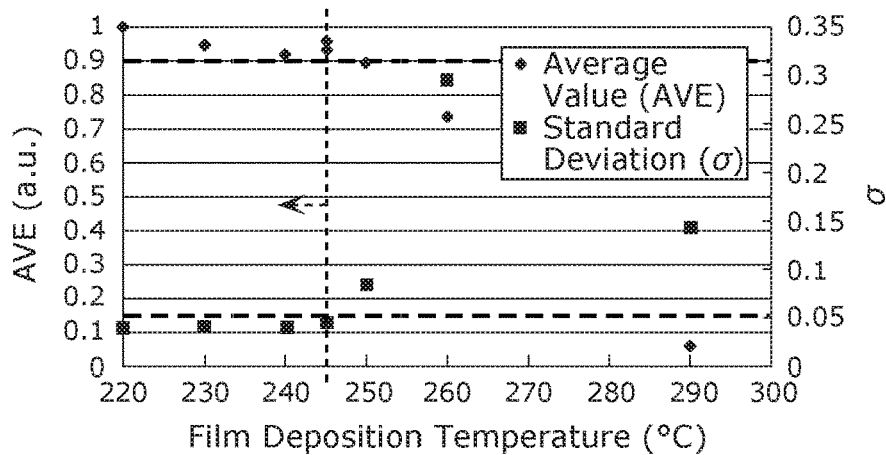
FIG. 8 illustrates the relationship between the film deposition temperature of an oxide film according to a comparative example and variations at each measurement point.

FIG. 8 illustrates the relationship between the film deposition temperature of the insulating layer 250 according to the comparative example and variations at each measurement point. Note that FIG. 8 illustrates values that are standardized by the average value of the carrier lifetime when the film deposition temperature of the insulating layer 250 is 220° C.

As illustrated in FIG. 8, in the case of a single-layer oxide film such as the sample 200, the uniformity of the electrical resistance of the oxide semiconductor layer 240 can be achieved when the insulating layer 250 is deposited at approximately 245° C. or less. It is noted here that the uniformity of the electrical resistance is regarded as achieved when the average value (AVE) of the carrier lifetime is 0.9 or higher and the standard deviation (σ) is 0.05 or less.

On the other hand, when the insulating layer 250 is deposited at 250° C. or higher, a low-resistance region is generated in the oxide semiconductor layer 240 and therefore the in-plane uniformity of the electrical resistance is not achieved because the average value decreases and the standard deviation increases. This would cause variations in the threshold voltage $V_{th}$ in a plane if the insulating layer is used as the channel layer of a thin-film transistor.

Thus, in order to improve the uniformity, it is conceivable to perform $N_2O$ plasma treatment after the film deposition of the oxide semiconductor layer 240 and before the film deposition of the insulating layer 250. That is, the plasma treatment is used to correct oxygen defects generated during the film deposition of the oxide semiconductor layer 240. The conditions for the plasma treatment are, for example, the same as the aforementioned "$N_2O$ plasma treatment conditions." Note that the substrate temperature during the plasma treatment is the same as the film deposition temperature of the insulating layer 250.

Figure 9:
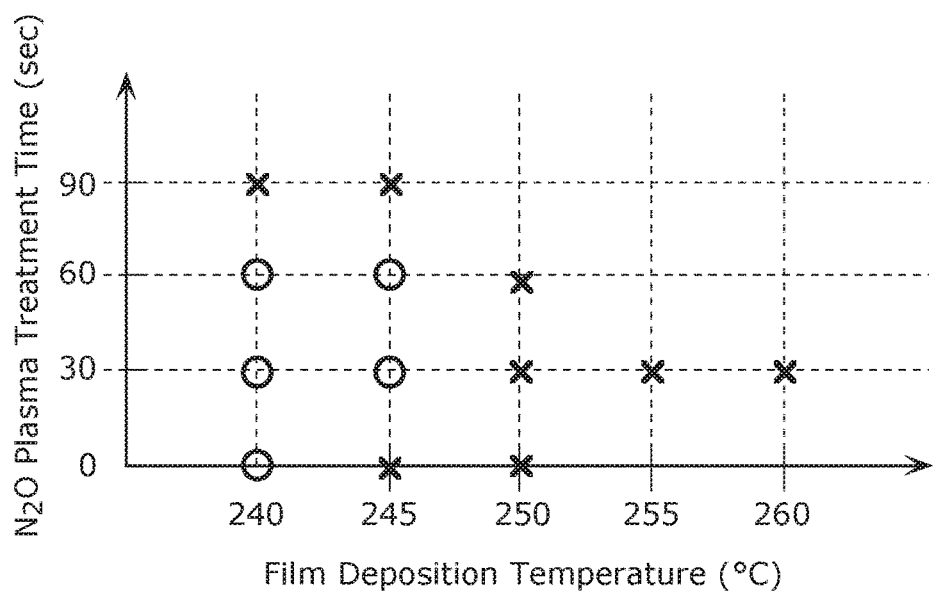
FIG. 9 illustrates the result of measuring the carrier lifetime with respect to a combination of the film deposition temperature of the oxide film according to a comparative example and the plasma treatment time.

FIG. 9 illustrates the result of measuring the carrier lifetime for the sample 200 that has undergone the $N_2O$ plasma treatment after the film deposition of the oxide semiconductor layer 240 and before the film deposition of the insulating layer 250. FIG. 9 illustrates the result of measuring the carrier lifetime with respect to a combination of the film deposition temperature of the insulating layer 250 according to the comparative example and the plasma treatment time.

In FIG. 9, white circles (O) indicate that the uniformity of the electrical resistance is achieved, and x marks (x) indicate that the uniformity of the electrical resistance is not achieved. That is, the white circles indicate that the conditions that the average value of the carrier lifetime be 0.9 or higher and the standard deviation be 0.05 or less are satisfied, and the x marks (x) indicate that these conditions are not satisfied. The same applies to FIGS. 10 to 12, which will be described later.

As illustrated in FIG. 9, when the film deposition temperature of the insulating layer 250 is 250° C. or higher, the uniformity of electrical resistance is not achieved in any of the cases. Thus, when the film deposition temperature of the insulating layer 250 is high, the uniformity of the electrical resistance cannot be maintained even if plasma treatment is performed before the film deposition of the insulating layer 250.

Also, as illustrated in FIG. 9, the uniformity of the electrical resistance is not achieved when the treatment time of the plasma treatment is 90 seconds. Thus, even if the film deposition temperature of the insulating layer 250 is low (e.g., 240° C.), the uniformity of the electrical resistance tends to deteriorate when a duration of the plasma treatment is longer than necessary.

This is considered because although some oxygen defects are corrected by the plasma treatment performed in a state in which the oxide semiconductor layer 240 is exposed to vacuum, the desorption of oxygen is accelerated by damage caused by the plasma. Thus, in the case of depositing the single-layer insulating layer 250 such as the sample 200, the uniformity cannot be improved even if plasma treatment is performed before the film deposition of the insulating layer 250.

4-3. Measurement Result for Sample (Two-Layer Structure)

Next is a description of the result of measuring the carrier lifetime using μ-PCD method for the sample 300 according to the embodiment, while changing the process conditions. The number of measurement points of the carrier lifetime is the same as in the case of the sample 200.

Figure 10:
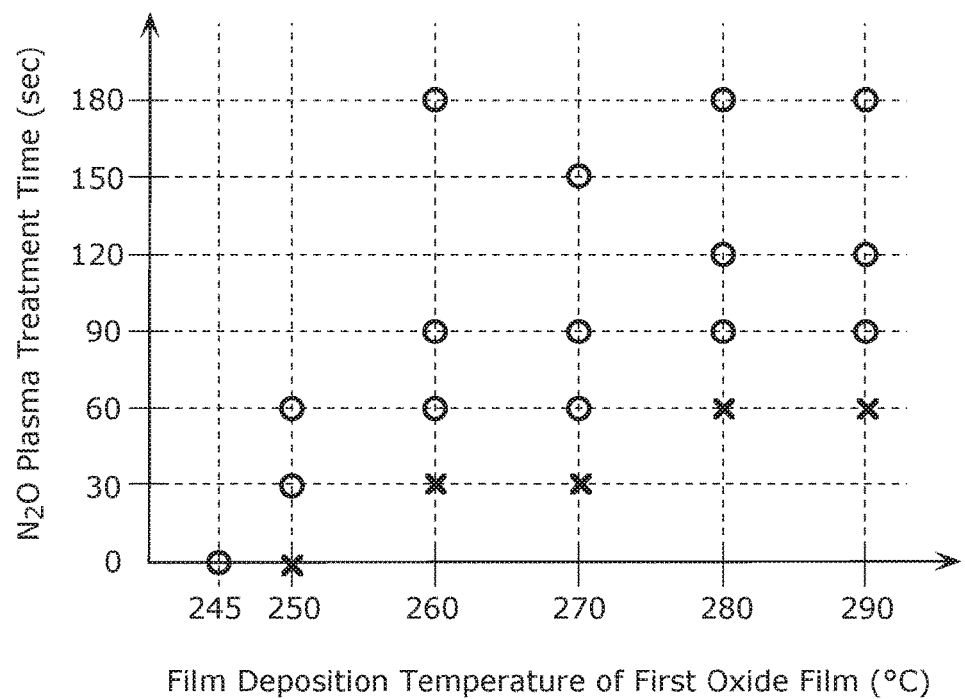
FIG. 10 illustrates the result of measuring the carrier lifetime with respect to a combination of the film deposition temperature of a first oxide film according to the embodiment and the plasma treatment time.

4-3-1. Film Deposition Temperature of First Oxide Film and Plasma Treatment Time First, the relationship between the film deposition temperature of the first oxide film 351 and the plasma treatment time will be described with reference to FIG. 10. FIG. 10 illustrates the result of measuring the carrier lifetime with respect to a combination of the film deposition temperature of the first oxide film 351 according to the embodiment and the plasma treatment time.

As illustrated in FIG. 10, when the film deposition temperature of the first oxide film 351 is high, there are cases where the uniformity cannot be achieved. More specifically, the uniformity cannot be achieved when the film deposition temperature of the first oxide film 351 is high and the plasma treatment time is short.

However, even if the film deposition temperature of the first oxide film 351 is high, the uniformity may be achieved by increasing the plasma treatment time. For example, when the film deposition temperature of the first oxide film 351 is 270° C., the uniformity cannot be achieved with 30-second plasma treatment time, whereas the uniformity can be achieved with 60-second or longer plasma treatment time.

In addition, unlike the case of the sample 200, the uniformity does not seem to deteriorate even if the plasma treatment time is long. For example, even if the plasma treatment time is 180 seconds, the uniformity is achieved in any of the cases where the film deposition temperature is 260° C., 280° C., and 290° C.

This is considered because the presence of the first oxide film 351 suppresses the desorption of oxygen from the oxide semiconductor layer 240. Another conceivable reason is that among oxygen and nitrogen atoms generated by the $N_2O$ plasma, only oxygen atoms can selectively pass through the first oxide film 351 and supply oxygen to the oxide semiconductor layer 240 without damaging the oxide semiconductor layer 240.

From the above, it can be seen that a duration of the plasma treatment may increase with the film deposition temperature of the first oxide film 351.

As illustrated in FIG. 8, the film deposition temperature of an oxide film is preferably 245° C. or higher. More preferably, the film deposition temperature of the first oxide film 351 is 270° C. or higher.

4-3-2. Film Thickness of First Oxide Film and Plasma Treatment Time

Figure 11:
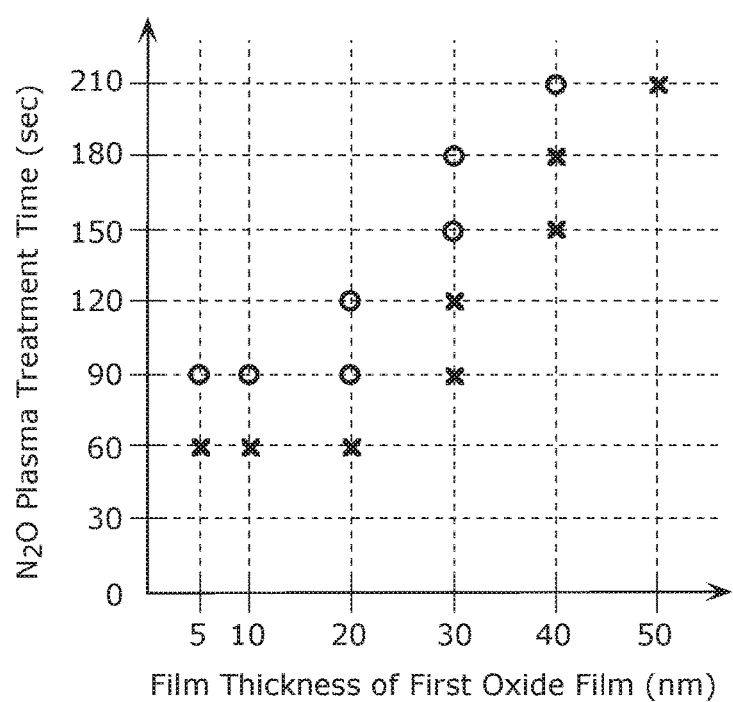
FIG. 11 illustrates the result of measuring the carrier lifetime with respect to a combination of the film thickness of the first oxide film according to the embodiment and the plasma treatment time.

Next, the relationship between the film thickness of the first oxide film 351 and the plasma treatment time will be described with reference to FIG. 11. FIG. 11 illustrates the result of measuring the carrier lifetime with respect to a combination of the film thickness of the first oxide film 351 according to the embodiment and the plasma treatment time.

Note that when the film thickness of the first oxide film 351 is changed, the film thickness of the second oxide film 352 is also changed so that a total film thickness of the first oxide film 351 and the second oxide film 352 becomes 200 nm. The film deposition temperatures of the first oxide film 351 and the second oxide film 352 are both 290° C.

As illustrated in FIG. 11, the uniformity cannot be achieved when the plasma treatment time is short. Also, the plasma treatment time required to achieve the uniformity increases as the film thickness of the first oxide film 351 increases.

Thus, it can be seen that the duration of the plasma treatment may increase with the film thickness of the first oxide film 351.

Note that when the first oxide film 351 is thick, the amount of oxygen desorbed from the oxide semiconductor layer 240 during the film deposition of the first oxide film 351 increases. Also, the oxygen supply effect decreases when the film thickness of the first oxide film 351 is large, because oxygen is supplied via the first oxide film 351 by the plasma treatment. That is, a longer plasma treatment time is necessary, which may reduce productivity.

Thus, in order to improve productivity, the process time is preferably shortened, and there are only small benefits in increasing the film thickness of the first oxide film 351 more than necessary. Accordingly, the film thickness of the first oxide film 351 may be 40 nm or less, preferably 20 nm or less. In order to maintain the in-plane uniformity of the film thickness, the film thickness of the first oxide film 351 may be 5 nm or more, preferably 10 nm or more.

Figure 12:
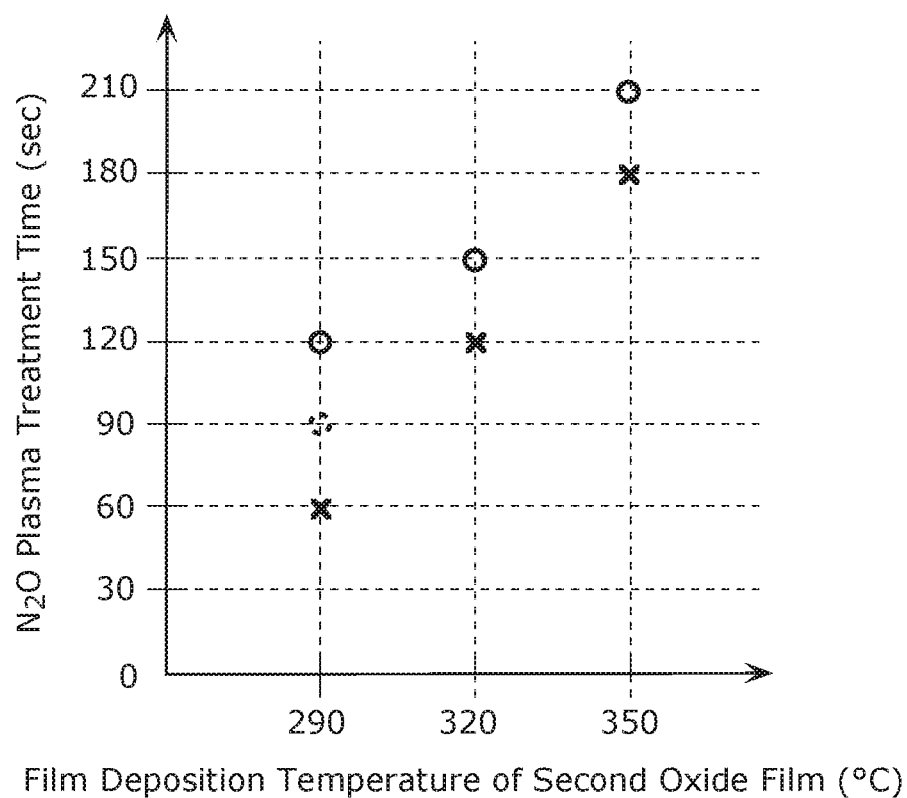
FIG. 12 illustrates the result of measuring the carrier lifetime with respect to a combination of the film deposition temperature of a second oxide film according to the embodiment and the plasma treatment time.

4-3-3. Film Deposition Temperature of Second Oxide Film and Plasma Treatment Time Next, the relationship between the film deposition temperature of the second oxide film 352 and the plasma treatment time will be described with reference to FIG. 12. FIG. 12 illustrates the result of measuring the carrier lifetime with respect to a combination of the film deposition temperature of the second oxide film 352 according to the embodiment and the plasma treatment time. Note that the film deposition temperature of the first oxide film 351 and the substrate temperature during the plasma treatment are both 290° C.

As illustrated in FIG. 12, the uniformity cannot be achieved when the plasma treatment time is short. Also, the plasma treatment time required to achieve the uniformity increases as the film deposition temperature of the second oxide film 352 increases. This is considered because although the first oxide film 351 is provided on the oxide semiconductor layer 240, the desorption of oxygen from the oxide semiconductor layer 240 is accelerated when the film deposition temperature of the second oxide film 352 is high.

Thus, it can be seen that the duration of the plasma treatment may increase with the film deposition temperature of the second oxide film 352.

Note that a higher film deposition temperature of the second oxide film 352 can improve the film quality of the second oxide film 352 and thereby can increase the resistance of the thin-film transistor to pressure. However, if the first oxide film 351 and the second oxide film 352 have different film deposition temperatures, another chamber is necessary or a waiting time occurs during the time required to change the temperature.

Thus, in either case, productivity deteriorates and the manufacturing cost increases. Accordingly, when there is no particular need to increase the resistance of the channel protective layer to pressure, the film deposition temperature of the second oxide film 352 may be the same as the film deposition temperature of the first oxide film 351 and also the same as the substrate temperature during the plasma treatment.

4-4. Film Deposition Conditions

From the above, the film deposition conditions for the oxide semiconductor layer 140, the first oxide film 151, and the second oxide film 152 in the method of manufacturing the TFT substrate 20 according to the embodiment are as follows.

The first oxide film 151 is, for example, formed by using the "ES1-SiO film deposition conditions" to deposit a silicon oxide film having a film thickness of 5 nm to 40 nm at a film deposition temperature of 245° C. or higher, preferably 270° C. or higher.

Here, increasing the ratio of the SiH4 gas increases the film deposition rate and improves productivity. This, however, increases the number of hydrogen radicals that occur during the film deposition and the amount of hydrogen in the silicon oxide film, thus increasing the amount of hydrogen penetrating into the oxide semiconductor layer 140. As a result, the resistance of the oxide semiconductor layer 140 undesirably decreases. Thus, the gas flow rate ratio of the $SiH_4$ gas ($SiH_4/(SiH_4+N_2O)$) is, for example, approximately 1.1% or less.

Alternatively, an argon gas or a nitrogen gas may be added to the introduction gas. This reduces the $N_2O$ gas, thus reducing the manufacturing cost. In addition, the argon gas or the nitrogen gas accelerates decomposition of $SiH_4$, thus increasing the film deposition rate and improving productivity. However, the oxide semiconductor layer 140 is damaged by ion bombardment during the film deposition. As a result, oxygen defects occur and the number of carriers increases, which reduces the resistance of the oxide semiconductor layer 140. Thus, the amount of addition of the argon gas or nitrogen gas is preferably small.

When the process pressure is too high and the process distance is too long, uniformity of the plasma spread deteriorates and accordingly the film deposition rate and the uniformity of the film deposition rate deteriorate. On the contrary, when the process pressure is too low and the process distance is too short, the energy of particles of the film deposition gas decomposed by the plasma increases, and damage to the oxide semiconductor layer 140 increases. Thus, for example, the process pressure is preferably higher than or equal to 0.5 torr and less than or equal to 1.5 torr, and the process distance is preferably greater than or equal to 400 mil and less than or equal to 700 mil. More preferably, the process pressure is higher than or equal to 0.7 torr and less than or equal to 1.0 torr, and the process distance is greater than or equal to 500 mil and less than or equal to 600 mil.

When the power density is too low, the film deposition gas has insufficient ability to decompose and the film quality deteriorates. That is, a silicon oxide film with a large number of oxygen defects is formed. This causes oxygen in the oxide semiconductor layer 140 to move to the silicon oxide film, increasing the number of carries in the oxide semiconductor layer 140 and reducing the resistance of the oxide semiconductor layer 140.

On the other hand, when the power density is too high, the oxide semiconductor layer 140 is more damaged and the resistance of the oxide semiconductor layer 140 decreases. Thus, the power density is preferably higher than or equal to 0.19 W/cm$^2$ and less than or equal to 0.3 W/cm$^2$.

The second oxide film 152 is, for example, formed by using the "ES2-SiO film deposition conditions," i.e., "ES1-SiO film deposition conditions," to deposit a silicon oxide film having a film thickness that makes the channel protective layer 150 have a film thickness of 500 nm or less, at a film deposition temperature of 270° C. or higher. The film deposition temperature of the second oxide film 152 is the same as the film deposition temperature of the first oxide film 151.

Because the second oxide film 152 has a greater film thickness than the first oxide film 151, it is conceivable to increase the film deposition rate by increasing the flow rate of the SiH$_4$ gas. This, however, causes hydrogen radials to penetrate into the first oxide film 151 and increases the amount of hydrogen penetrating into the oxide semiconductor layer 140 as described above. Thus, the flow rate of the SiH$_4$ gas is preferably not too higher than the flow rate thereof during the film deposition of the first oxide film 151. The same as described above for the first oxide film 151 also applies to the process pressure, the process distance, and the power density.

After the first oxide film 151 is deposited and before the second oxide film 152 is deposited, N$_2$O plasma treatment is performed using the aforementioned "N$_2$O plasma treatment conditions." The plasma treatment time is, for example, in the range of 5 seconds to 300 seconds, preferably in the range of 30 seconds to 180 seconds.

The substrate temperature during the N$_2$O plasma treatment is the same as the film deposition temperatures of the first oxide film 151 and the second oxide film 152. This allows the film deposition of the first oxide film 151, the N$_2$O plasma treatment, and the film deposition of the second oxide film 152 to be implemented within the same chamber.

In addition, the process time can be shortened because there is no need for the time required to change the substrate temperature.

When the second oxide film 152 is deposited at a higher temperature than the film deposition temperature of the first oxide film 151 in order to improve the film quality of the second oxide film 152, the substrate temperature during the N$_2$O plasma treatment is set to be the same as the film deposition temperature of the second oxide film 152. That is, the N$_2$O plasma treatment may be performed immediately before the film deposition of the second oxide film 152, within the same chamber used to deposit the second oxide film 152. This increases permeability of the plasma.

5. Concentration Profiles (SIMS Analysis) of Elements in Silicon Oxide Film

Next is a description of the results of secondary ion mass spectroscopy (SIMS) analysis conducted to check impurity distributions in the silicon oxide film deposited by the manufacturing method according to the embodiment. More specifically, three samples A to C are prepared, and SIMS analysis is conducted on each of the samples.

The structures of the samples A and C are the same as the structure of the sample 200 illustrated in FIG. 7A. That is, the samples A and C include the insulating layer 250 made of a single-layer silicon oxide film on the oxide semiconductor layer 240.

The structure of the sample B is the same as the structure of the sample 300 illustrated in FIG. 7B. That is, the sample B includes the insulating layer 350 made of a two-layer silicon oxide film on the oxide semiconductor layer 240.

In the samples A to C, the substrate 210 is a 6-inch P-type silicon substrate (with resistivity of 9 to 12 Ωcm). The reason for using the P-type silicon substrate instead of a glass substrate is because charge-up during the SIMS analysis is suppressed. This P-type silicon substrate was attached to the vicinity of the center of a G8.5 glass substrate (0.7 mm thick, X: 2500 mm×Y: 2200 mm), and the oxide semiconductor layer 240 and the insulating layer 250 were deposited thereon. The film deposition conditions for the oxide semiconductor layer 240 and the insulating layer 250 were as described above ("TAOS film-deposition conditions" and "single-layer SiO film deposition conditions").

At this time, for the sample A, N$_2$O plasma treatment was performed for 30 seconds after the film deposition of the oxide semiconductor layer 240 and before the film deposition of the insulating layer 250. The insulating layer 250 had a film thickness of 190 nm. For the sample C, a 190 nm silicon oxide film was deposited as the insulating layer 250 without performing N$_2$O plasma treatment.

For the sample B, N$_2$O plasma treatment was performed for 120 seconds after the film deposition of a 20-nm first oxide film 351 and before the film deposition of a 170-nm second oxide film 352. The film deposition conditions for the first oxide film 351 and the second oxide film 352 and the conditions for the N$_2$O plasma treatment were as described above ("ES1-SiO film deposition conditions," "ES2-SiO film deposition conditions," and "N$_2$O plasma treatment conditions"). Note that the film deposition temperatures and the substrate temperature during the plasma treatment were 290° C.

5-1. Concentration Profile of Fluorine (F)

Figure 13A:
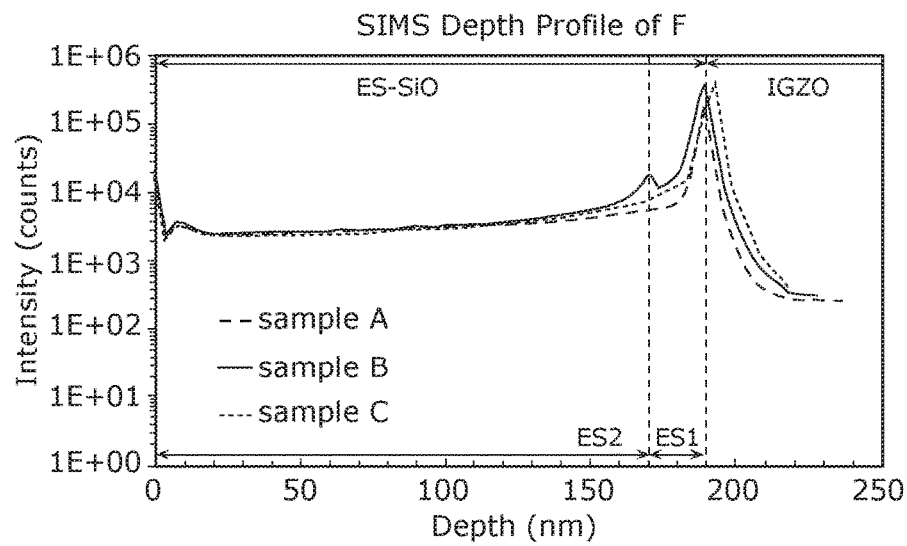
FIG. 13A illustrates a concentration profile of fluorine elements in the oxide film according to the embodiment.
Figure 13B:
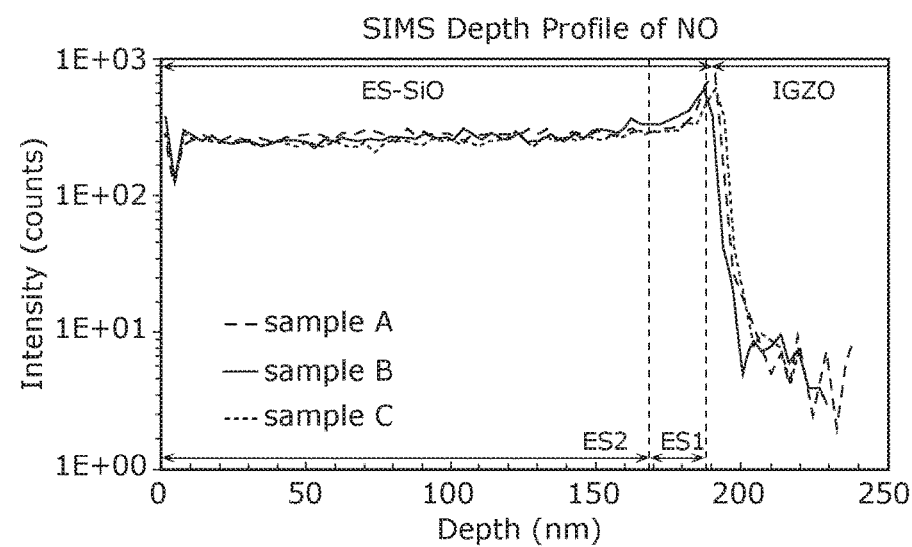
FIG. 13B illustrates a concentration profile of nitric oxide in the oxide film according to the embodiment.
Figure 13C:
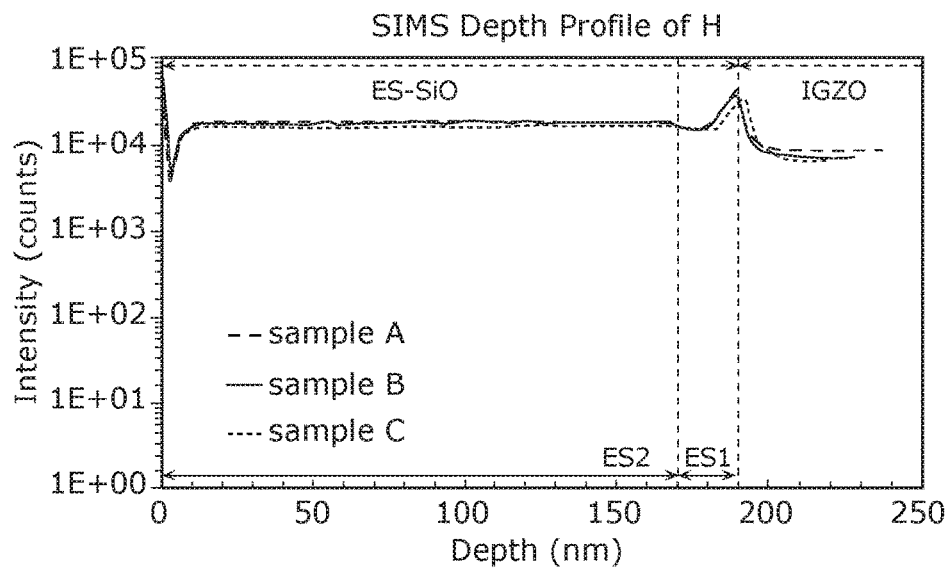
FIG. 13C illustrates a concentration profile of hydrogen elements in the oxide film according to the embodiment.
Figure 13D:
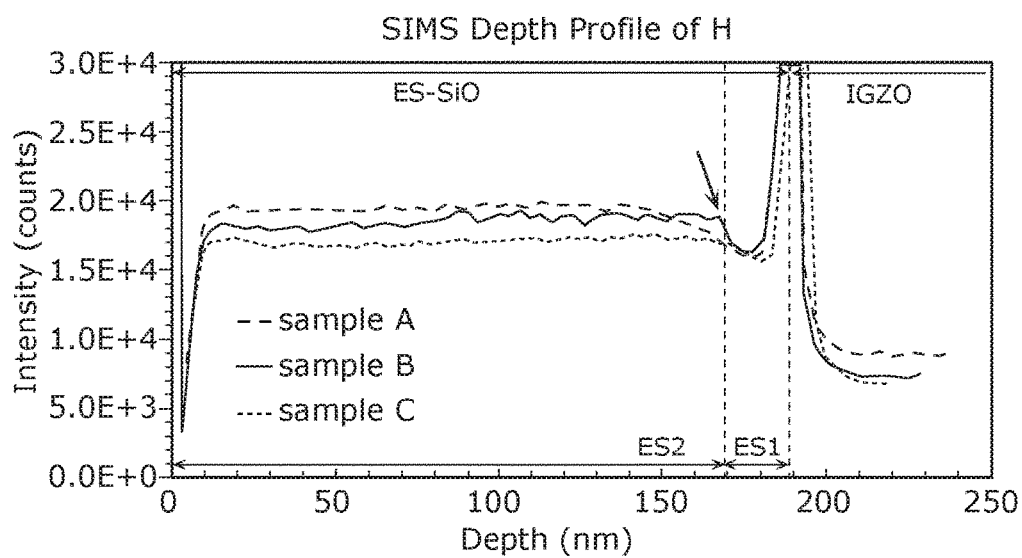
FIG. 13D illustrates a concentration profile of hydrogen elements (in linear scale) in the oxide film according to the embodiment.

FIGS. 13A to 13E illustrate concentration profiles of fluorine elements (F), nitric oxide (NO), hydrogen elements (H), silicon nitride (SiN) in the oxide film according to the embodiment. Note that FIGS. 13A to 13C and 13E plot concentration profiles on semilogarithmic graphs, whereas FIG. 13D plots concentration profiles on linear graphs.

As illustrated in FIG. 13A, for the samples A and C, the concentration of fluorine elements shows a peak only in proximity to the interface between the insulating layer 250 (silicon oxide film: ES-SiO) and the oxide semiconductor layer 240 (IGZO) (to be more specific, within the range of ±10 nm from the interface (about 190 nm depth)).

Note that the origin of fluorine elements is considered as a fluoridation product remaining on the inner wall of the chamber used for plasma CVD. The fluoridation product is formed and accumulated on the inner wall of the chamber at the time of generation of $NF_3$ plasma that is used to clean the inner wall of the chamber. The peak at the interface between the insulating layer 250 and the oxide semiconductor layer 240 is considered to have appeared because before the insulating layer 250 is deposited, fluorine elements desorbed from the inner wall of the chamber adsorb on the surface of the oxide semiconductor layer 240 and then the insulating layer 250 is deposited. Comparison of the samples A and C shows that the concentration of fluorine elements is reduced by performing $N_2O$ plasma treatment before the film deposition of the insulating layer 250.

On the other hand, for the sample B, the concentration profile of fluorine elements shows another peak (second peak) in addition to the peak (first peak) in proximity to the interface between the insulating layer 350 and the oxide semiconductor layer 240. More specifically, the second peak appears in proximity to the boundary between the first oxide film 351 (ES1) and the second oxide film 352 (ES2) (to be more specific, within the range of ±10 nm from the interface (about 170 nm depth); the same applies hereinafter). The second peak is lower than the first peak as illustrated in FIG. 13A. For the sample B, the second peak appears due to fluorine elements that have adsorbed on the surface of the first oxide film 351 after the film deposition of the first oxide film 351 and that are not removed by the $N_2O$ plasma treatment.

Thus, when the two-layer insulating layer 350 is formed as in the manufacturing method of the embodiment, the concentration of fluorine elements shows a peak in proximity to the interface between the first oxide film 351 and the second oxide film 352. The same applies to the case where oxide films are laminated. That is, the number of peaks appearing in the insulating layer is equal to the number obtained by subtracting one from the number of laminated oxide films.

5-2. Concentration Profile of Nitric Oxide (NO)

FIG. 13B illustrates concentration profiles of nitric oxide (NO) detected as $NO^-$ ions. As illustrated in FIG. 13B, for the samples A to C, the concentration of NO shows a peak in proximity to the interface between the insulating layer 250 or 350 and the oxide semiconductor layer 240. For the sample B, the profile also shows a peak with a higher NO concentration than for the samples A and C, in proximity to a depth position of the second peak of fluorine elements. More specifically, for the sample B, a peak in the NO concentration appears in proximity to the depth position of the second peak of fluorine elements.

This is considered due to the $N_2O$ plasma treatment being performed in proximity to the depth position of the second peak, i.e., performed after the film deposition of the first oxide film 351 and before the film deposition of the second oxide film 352. That is, it is considered that nitrogen elements generated by the $N_2O$ plasma treatment are implanted into the first oxide film 351, increasing the NO concentration in the first oxide film 351. Note that the reason for a region with a high NO concentration spreading to the second oxide film 352 is considered because nitrogen elements diffuse during and after the film deposition of the second oxide film 352.

In this way, with the manufacturing method of the embodiment in which plasma treatment is performed when forming the two-layer insulating layer 350, inevitably the concentration of fluorine elements shows a peak not only in proximity to the interface between the insulating layer 350 and the oxide semiconductor layer 240, but also in proximity to the interface (±10 nm) between the first oxide film 351 and the second oxide film 352. The concentration of NO elements also shows a peak in proximity to the interface between the first oxide film 351 and the second oxide film 352.

5-3. Concentration Profile of Hydrogen (H)

As illustrated in FIG. 13C, for the samples A to C, the concentration of hydrogen elements shows a peak only in proximity to the interface between the insulating layer 250 or 350 and the oxide semiconductor layer 240. For the sample B, the concentration of hydrogen elements shows no peak in proximity to the interface between the first oxide film 351 and the second oxide film 352.

Here, FIG. 13D illustrates the concentration profiles of hydrogen elements plotted on linear graphs, in order to check more detailed behaviors of the concentration profile of hydrogen elements in proximity to the interface.

Focusing on the vicinity of the interface between the first oxide film 351 and the second oxide film 352, the rate of change of the concentration in the direction of film thickness is constant (the concentration continuously changes) for the samples A and C, whereas the rate of change fluctuates (the concentration discontinuously changes) for the sample B (see the arrow in FIG. 13D). That is, for the sample B, the concentration profile of hydrogen elements discontinuously changes in proximity to the interface.

The discontinuity of the change of concentration in proximity to the interface or the discontinuity of the concentration profile specifically indicates that the rate of change in the concentration profile has a peak in proximity to the interface. That is, for the sample B, the rate of change in the concentration profile has a peak in proximity to the interface between the first oxide film 351 and the second oxide film 352. More specifically, the rate of change in the concentration profile of hydrogen elements increases in proximity to the interface, as compared with immediately under and above the vicinity of the interface. For example, the concentration profile of hydrogen elements is generally constant within the second oxide film 352 or within the first oxide film 351, whereas the concentration profile greatly changes in proximity to the interface.

This indicates that the $N_2O$ plasma treatment performed before the film deposition of the second oxide film 352 affects the concentration profile of hydrogen in the oxide films. Although detailed mechanism causing such a distribution is not clear, a conceivable reason is that a minute amount of hydrogen liberated from a residue attachment on the side wall of the film deposition chamber during the $N_2O$ plasma treatment adheres to the interface between the first oxide film 351 and the second oxide film 352 and finds its way into the films. However, comparison of the samples A to C shows equivalent levels of hydrogen concentrations in the oxide films. Thus, at least the amount of hydrogen in the oxide films is not increased by the $N_2O$ plasma treatment performed before the film deposition of the second oxide film 352, and it can be said that there is no risk that the uniformity will deteriorate as a result of the resistance being reduced due to reduction of the TAOS caused by hydrogen in the oxide films and the threshold voltage $V_{th}$ of the TFT being shifted in a negative direction.

5-4. Concentration Profile of Silicon Nitride (SiN)

Figure 13E:
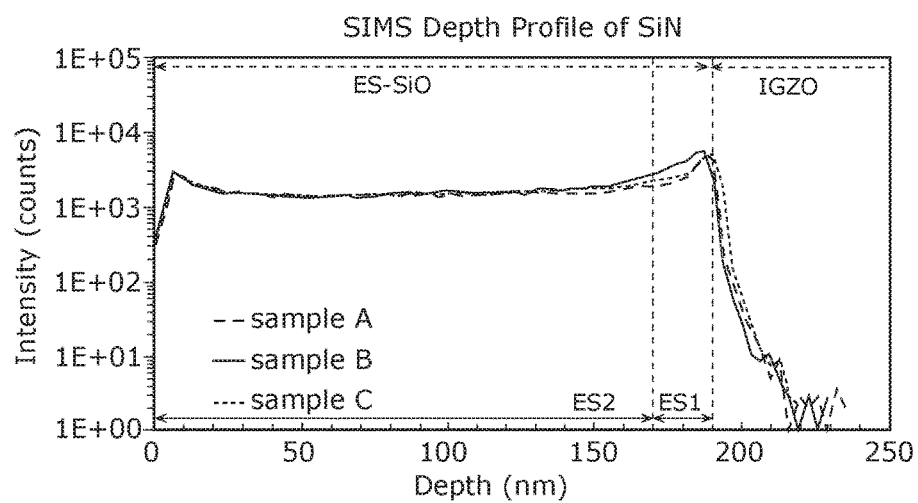
FIG. 13E illustrates a concentration profile of silicon nitride in the oxide film according to the embodiment.

FIG. 13E illustrates a concentration profile of silicon nitride (SiN) detected as $SiN^-$ ions. As illustrated in FIG. 13E, for the sample B that adopts the $N_2O$ plasma treatment before the film deposition of the second oxide film 352, the concentration of silicon nitride is higher than the concentrations for the samples A and C, in particular in the region of the first oxide film 351. This indicates that the $N_2O$ plasma treatment performed before the film deposition of the first oxide film 351 causes nitriding of the first oxide film 351.

On the other hand, the concentration of silicon nitride (SiN) at the interface between the insulating layer 250 or 350 and the oxide semiconductor layer 240 is equivalent for the samples A to C. That is, the $N_2O$ plasma treatment performed after the film deposition of the first oxide film 351 can cause nitriding of the first oxide film 351 without increasing the concentration of nitrogen at the interface between the first oxide film 351 and the oxide semiconductor layer 240.

In general, the nitriding of a silicon oxide film allows defects in the silicon oxide film to be corrected by highly-coupled nitrogen atoms, thus enabling formation of a film with excellent stress resistance. By using such a film as the channel protective layer, the effect of improving the reliability of the TFT can also be expected from the present disclosure.

Similar distributions to the above-described element distributions may also be obtained by, for example, mixing a nitrogen-based gas with a film deposition gas at a proper rate to form a silicon oxynitride film (SiON) when the first oxide film 351 is deposited and making the silicon oxynitride film stand by for a predetermined of time within a film deposition chamber until the film deposition of the second oxide film 352. In this case, the nitrogen-based gas is preferably a nitrogen gas ($N_2$) that does not contain hydrogen. However, if, for example, a silicon oxynitride film having a high nitrogen concentration in the silicon oxide film is formed in the first oxide film 351, inevitably the nitrogen concentration at the interface between the first oxide film 351 and the oxide semiconductor layer 240 increases. This causes an increase in the number of fixed charges at the interface or in the number of carrier trap levels, and therefore an improvement in the electrical reliability of the TFT cannot be expected. Accordingly, forming a silicon oxynitride film is undesirable as a method of forming the insulating layer 350.

Hereinabove, the distributions of elements, more specifically, a peak of fluorine elements, a peak of nitric oxide, and discontinuity of the rate of change of the hydrogen concentration in the vicinity (within the range of ±10 nm) of the interface between the first oxide film 351 and the second oxide film 352, have been described as the result of implementing the process of forming a channel protective layer (oxide film) according to the present disclosure. Also, aside from the effects intended by the present disclosure, the $N_2O$ plasma treatment performed after the film deposition of the first oxide film 351 causes nitriding of the channel protective layer that is in contact with the oxide semiconductor layer 240, thereby reducing defects in the film. At this time, defects in the film can be reduced without increasing the nitrogen concentration at the interface between the first oxide film 351 and the oxide semiconductor layer 240. Because of this, degradation of quality at the interface due to increased nitrogen concentration is not caused, and it can also be expected that this fact may become some help for improving the electrical reliability of the TFT.

6. Reliability Evaluation (PBTS Test)

Next is a description of the result of conducting a positive bias temperature stress (PBTS) test on the TFT substrate 20 manufactured by the manufacturing method of the embodiment illustrated in FIGS. 5A and 5B.

The stress conditions for the PBTS test are that the temperature is 90° C., the gate-source voltage is +20V, the drain-source voltage is 0V, and the time is 2000 seconds. The measurement conditions for the PBTS test are that the drain-source voltage is 5V, the range of the gate-source voltage is from −10V to +10V, and the voltage step is 0.1V. Note that the channel width and channel length of the TFT substrate targeted for the PBTS test are both 12 μm. When the coordinates (X, Y) at the lower left corner of the substrate is expressed as (0, 0), the X coordinates of measurement positions range from 1400 mm to 2400 mm and the Y coordinates thereof are 960 mm.

6-1. Comparative Example 1

Figure 14A:
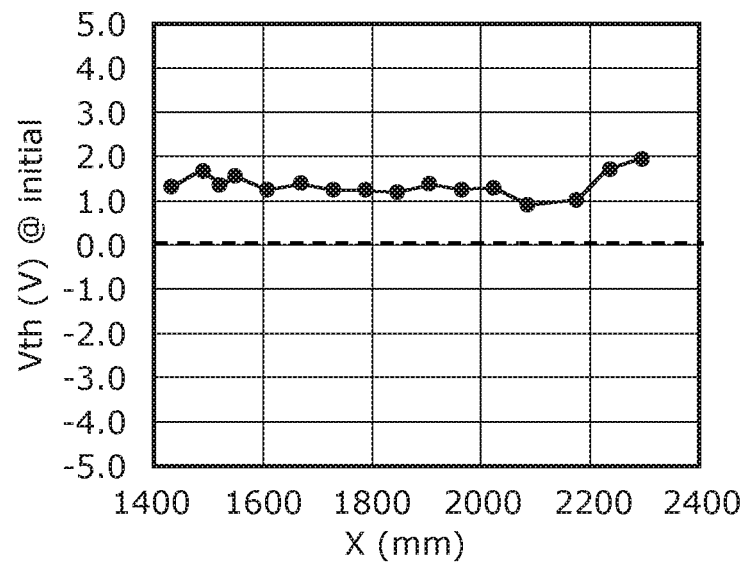
FIG. 14A illustrates initial characteristics of a threshold voltage of a thin-film transistor according to a comparative example.
Figure 14B:
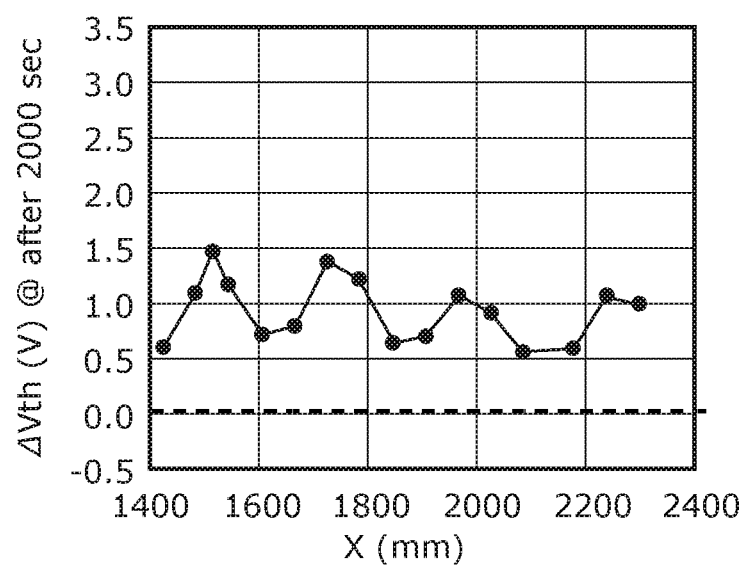
FIG. 14B illustrates post-stress characteristics of the threshold voltage of the thin-film transistor according to the comparative example.

First, the result of conducting the PBTS test on a thin-film transistor that includes a single-layer channel protective layer will be described as a comparative example 1 with reference to FIGS. 14A and 14B. FIGS. 14A and 14B respectively illustrate initial characteristics and post-stress characteristics of the threshold voltage of the thin-film transistor according to the comparative example 1.

The channel protective layer of the thin-film transistor according to the comparative example 1 has a film thickness of 200 nm and is deposited at a film deposition temperature of 245° C. The other film deposition conditions are the same as the aforementioned "single-layer SiO film deposition conditions." Also, $N_2O$ plasma treatment is performed after the formation of the oxide semiconductor layer 140 and before the formation of the channel protective layer. The conditions for the plasma treatment are the same as the aforementioned "$N_2O$ plasma treatment conditions."

As illustrated in FIG. 14A, the initial characteristics of the thin-film transistor according to the comparative example 1 show small variations within the substrate. Specifically, 3σ is 0.76.

On the other hand, the amount of change $\Delta V_{th}$ of the threshold voltage increases as illustrated in FIG. 14B. That is, the reliability of the thin-film transistor deteriorates. More specifically, the average value of $\Delta V_{th}$ is 0.92 and 3σ is 0.87, i.e., the threshold voltage changes more as compared with the initial characteristics, and variations in the amount of the change increase.

6-2. Comparative Example 2

Figure 15A:
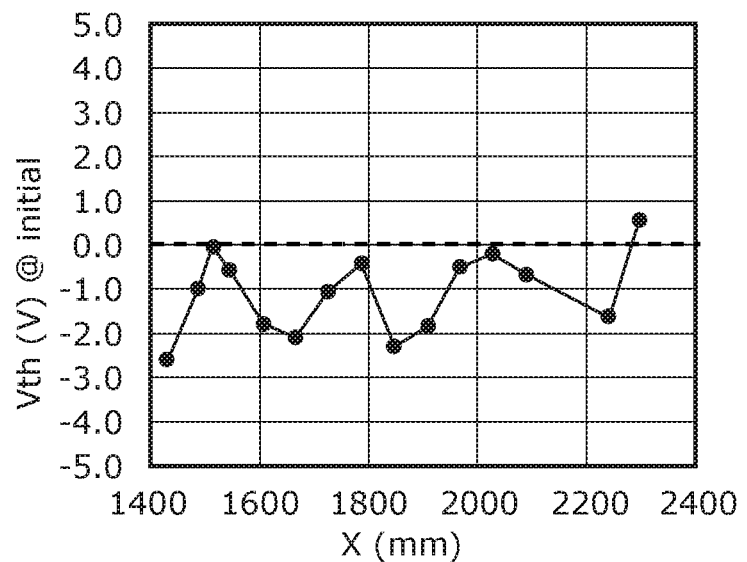
FIG. 15A illustrates initial characteristics of the threshold voltage of a thin-film transistor according to another comparative example.
Figure 15B:
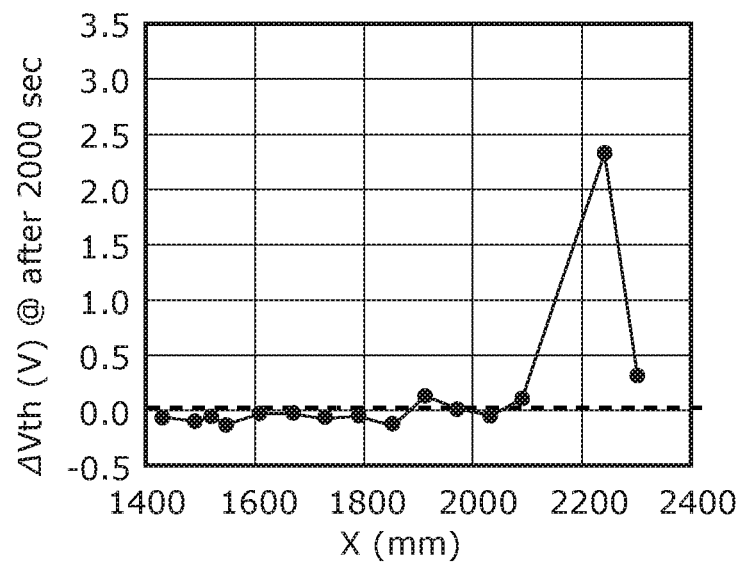
FIG. 15B illustrates post-stress characteristics of the threshold voltage of the thin-film transistor according to the other comparative example.

Next, the result of conducting the PBTS test on a thin-film transistor that includes a single-layer channel protective layer will be described as a comparative example 2 with reference to FIGS. 15A and 15B. FIGS. 15A and 15B respectively illustrate initial characteristics and post-stress characteristics of the threshold voltage of the thin-film transistor according to the comparative example 2.

The thin-film transistor according to the comparative example 2 differs from the thin-film transistor according to the comparative example 1 in the film deposition temperature of the channel protective layer. More specifically, the channel protective layer of the thin-film transistor according to the comparative example 2 is deposited at a film deposition temperature of 280° C. to have a film thickness of 200 nm. The other film deposition conditions are the same as the aforementioned "single-layer SiO film deposition conditions." Also, $N_2O$ plasma treatment is performed after the formation of the oxide semiconductor layer 140 and before the formation of the channel protective layer. The conditions for the plasma treatment are the same as the aforementioned "$N_2O$ plasma treatment conditions."

As illustrated in FIG. 15A, the initial characteristics of the thin-film transistor according to the comparative example 2 show great variations in the threshold voltage $V_{th}$ within the substrate. More specifically, 3σ is 2.56.

On the other hand, as illustrated in FIG. 15B, the post-stress characteristics show that the amount of change $\Delta V_{th}$ in the threshold voltage approaches 0V, thus increasing reliability. However, a region showing a large amount of change $\Delta V_{th}$ exists at positions having X coordinates of 2000 mm to 2400 mm. Thus, the reliability of the thin-film transistor is poor in the peripheral portion of the substrate.

6-3. Two-Layer Structure

Figure 16A:
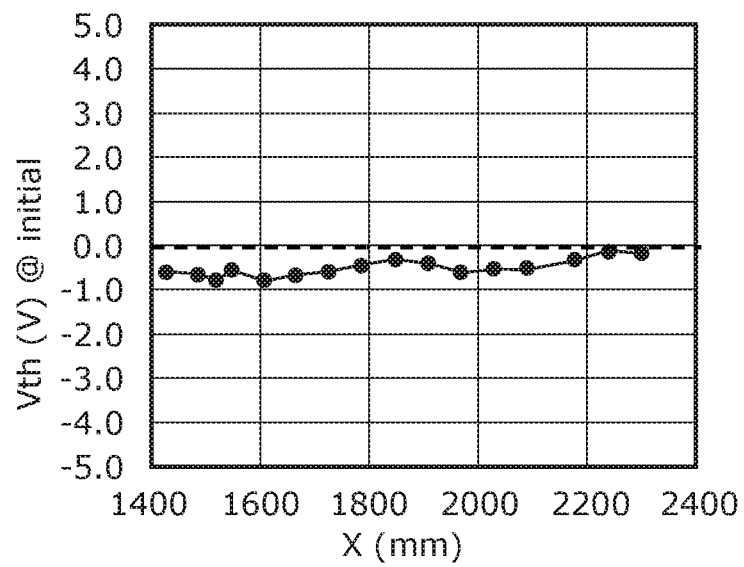
FIG. 16A illustrates initial characteristics of the threshold voltage of the thin-film transistor according to the embodiment.
Figure 16B:
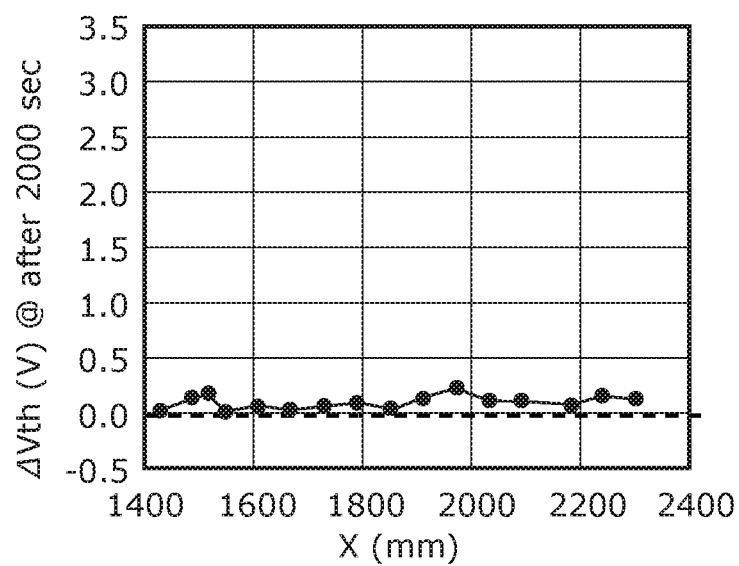
FIG. 16B illustrates post-stress characteristics of the threshold voltage of the thin-film transistor according to the embodiment.

Next, the result of conducting the PBTS test on the thin-film transistor 100 including the two-layer channel protective layer 150 according to the embodiment will be described with reference to FIGS. 16A and 16B. FIGS. 16A and 16B respectively illustrate initial characteristics and post-stress characteristics of the threshold voltage of the thin-film transistor 100 according to the embodiment.

The first oxide film 151 and the second oxide film 152 of the thin-film transistor 100 according to the embodiment respectively have film thicknesses of 20 nm and 180 nm and are deposited at a film deposition temperature of 290° C. The other film deposition conditions are the same as the aforementioned "ES1-SiO film deposition conditions" and the aforementioned "ES2-SiO film deposition conditions." Also, $N_2O$ plasma treatment is performed after the film deposition of the first oxide film 151 and before the film deposition of the second oxide film 152. The conditions for the plasma treatment are the same as the aforementioned "$N_2O$ plasma treatment conditions." Note that the substrate temperature during the plasma treatment is 290° C.

As illustrated in FIG. 16A, the initial characteristics of the thin-film transistor 100 according to the embodiment show an improvement in the uniformity of the threshold voltage $V_{th}$. More specifically, 3σ is 0.56.

Also, as illustrated in FIG. 16B, the post-stress characteristics show that the amount of change Δ Vth in the threshold voltage approaches 0V, thus increasing reliability. More specifically, the average value of $\Delta V_{th}$ is 0.10, and 3σ is 0.17.

In this way, with the embodiment, it is possible to improve reliability and to reduce variations within the substrate.

7. Summary

As described above, the method of manufacturing the TFT substrate 20 according to the embodiment includes the step of forming the oxide semiconductor layer 140 above the substrate 110, the step of forming the first oxide film 151 on the oxide semiconductor layer 140, the step of performing oxidation processing on the oxide semiconductor layer 140 after formation of the first oxide film 151, and the step of forming the second oxide film 152 on the first oxide film 151 after the oxidation processing.

By, in this way, performing the oxidation processing after formation of the first oxide film 151 on the oxide semiconductor layer 140, oxygen defects at the interface between the oxide semiconductor layer 140 and the first oxide film 151 can be efficiently corrected. Even if the film deposition temperature of the second oxide film 152 is increased, the first oxide film 151 suppresses the desorption of oxygen from the oxide semiconductor layer 140, thereby suppressing deterioration of the oxide semiconductor layer 140 and enabling formation of a high-quality oxide film. Accordingly, the thin-film transistor 100 with excellent uniformity and reliability of characteristics can be manufactured.

For example, in the step of performing oxidation processing, the duration of the oxidation processing may increase with the film deposition temperature of the first oxide film 151.

In this way, when the film deposition temperature of the first oxide film 151 is increased to improve film quality, the duration of the oxidation processing increases to properly correct oxygen defects. It is thus possible to suppress degradation of the oxide semiconductor layer 140 and to form a high-quality oxide film.

For example, the film deposition temperature of the first oxide film 151 may be 270° C. or higher.

This allows the first oxide film 151 to be formed with high quality and, for example, allows the first oxide film 151 to be used as a channel protective layer.

For example, in the step of performing oxidation processing, the duration of the oxidation processing may increase with the film thickness of the first oxide film 151.

In this way, when the film thickness of the first oxide film 151 is increased, the duration of the oxidation processing increases to properly correct oxygen defects.

For example, the film thickness of the first oxide film 151 may be greater than or equal to 5 nm and less than or equal to 40 nm.

This suppresses the desorption of oxygen from the oxide semiconductor layer 140 and allows oxygen generated by the oxidation processing to be properly supplied to the oxide semiconductor layer 140. Since the first oxide film 151 is thin with a film thickness of 5 nm to 40 nm, the amount of oxygen defects generated in the oxide semiconductor layer 140 during the film deposition of the first oxide film 151 can be suppressed.

For example, in the step of performing oxidation processing, the duration of the oxidation processing may increase with the film deposition temperature of the second oxide film 152.

In this way, when the film deposition temperature of the second oxide film 152 is increased to improve film quality and increase resistance to pressure, the duration of the oxidation processing increases to properly correct oxygen defects. It is thus possible to suppress degradation of the oxide semiconductor layer 140 and to form a high-quality oxide film.

For example, the film deposition temperature of the second oxide film 152 may be the same as the temperature during the oxidation processing.

This allows the second oxide film 152 to be formed with high quality and, for example, allows the second oxide film 152 to be used as a high pressure-proof channel protective layer.

For example, the oxidation processing may be plasma treatment.

In this case, oxygen defects at the interface between the oxide semiconductor layer 140 and the first oxide film 151 and oxygen defects within the oxide semiconductor layer 140 can be properly corrected.

In the step of performing oxidation processing, for example, the plasma treatment may be performed using a nitrous oxide gas for a period of time that is greater than or equal to 5 seconds and less than or equal to 300 seconds.

In this case, for example, the oxidation processing may use the same gas as used for the film deposition of the first oxide film 151 and the second oxide film 152. This increases convenience in productivity such as simplifying the apparatus and reducing cost. For example, it is common for a mass-production plasma CVD apparatus using a large-sized (G8 or more) substrate to use a silane gas and a nitrous oxide gas as film deposition gases of a silicon oxide film. Thus, the plasma treatment and the film deposition of silicon oxide films serving as the first oxide film 151 or the second oxide film 152 can be continuously performed within the same chamber.

For example, the first oxide film 151 and the second oxide film 152 may be silicon oxide films.

For example, the oxide semiconductor layer 140 may be a transparent amorphous oxide semiconductor.

For example, the oxide semiconductor layer 140 may be InGaZnO.

The TFT substrate 20 according to the embodiment includes the substrate 110, the oxide semiconductor layer 140, the first oxide film 151, and the second oxide film 152, the oxide semiconductor layer 140, the first oxide film 151, the second oxide film 152 being sequentially laminated above the substrate 110. Referring to the concentration profiles of elements in the direction of lamination, the concentration profile of fluorine elements shows a peak in proximity to the boundary between the first oxide film 151 and the second oxide film 152, the concentration profile of nitric oxide shows that the concentration in proximity to the boundary is higher than the concentration in proximity to the center of the second oxide film 152, and the concentration profile of hydrogen elements discontinuously changes in proximity to the boundary.

Variations

Figure 17A:
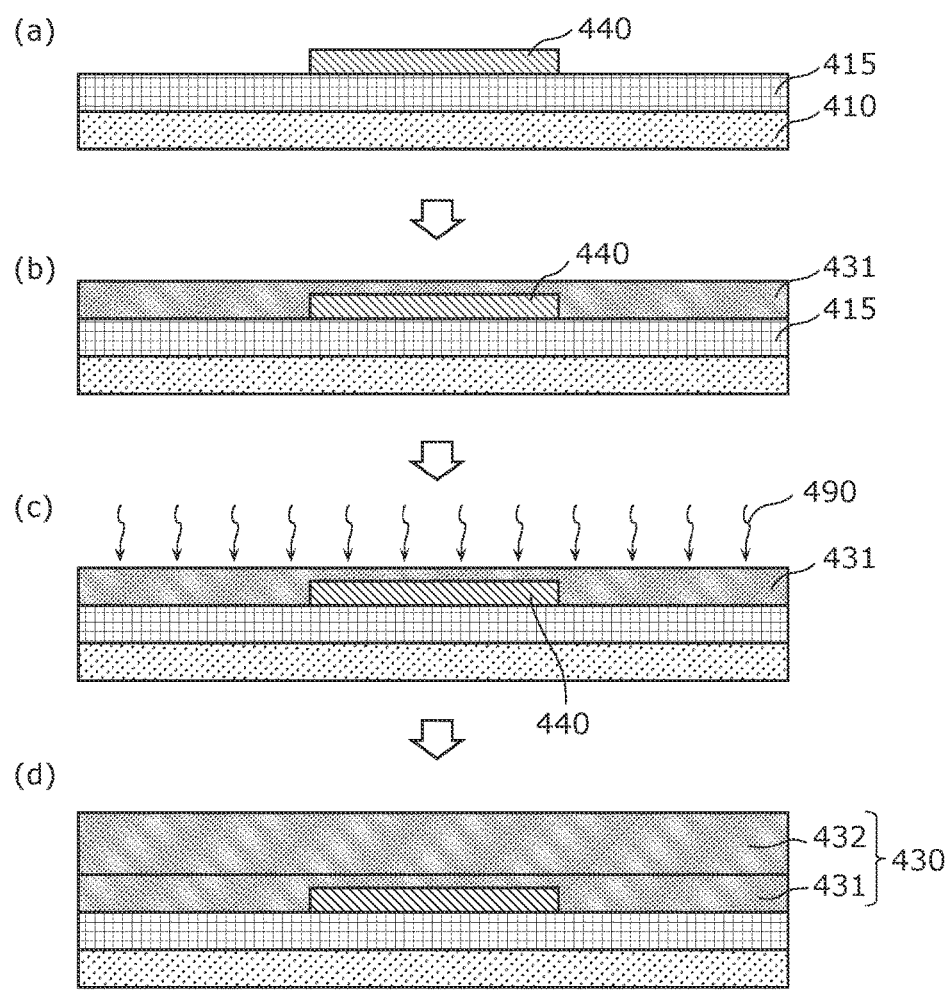
FIG. 17A is a schematic cross-sectional view illustrating a method of manufacturing a thin-film transistor substrate according to a variation of the embodiment.
Figure 17B:
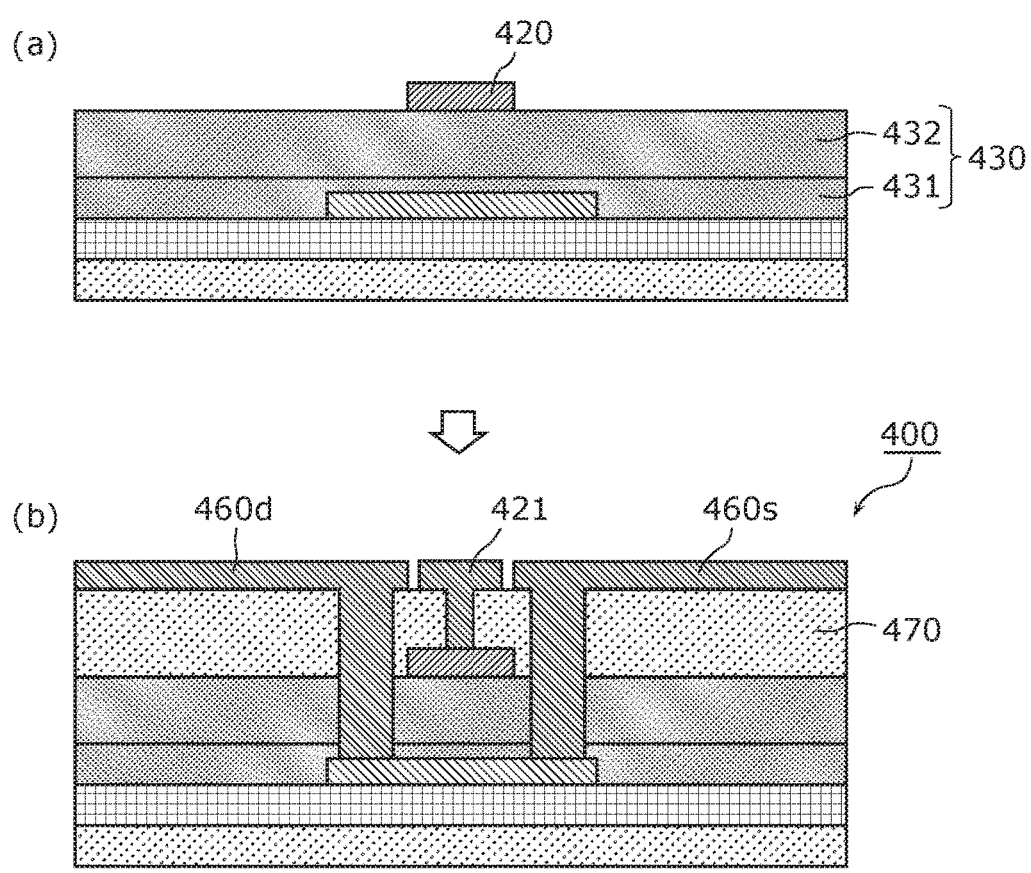
FIG. 17B is a schematic cross-sectional view illustrating a method of manufacturing a thin-film transistor substrate according to the variation of the embodiment.

While the above-described embodiment takes the example of the case where the thin-film transistor is a bottom-gate type transistor, the thin-film transistor may be a top-gate type transistor. In a variation of the embodiment, a method of manufacturing a top-gate type thin-film transistor 400 will be described with reference to FIGS. 17A and 17B. FIGS. 17A and 17B are schematic cross-sectional views illustrating the method of manufacturing the thin-film transistor 400 according to the embodiment.

Formation of Buffer Layer

First, as illustrated in (a) in FIG. 17A, a substrate 410 is prepared and a buffer layer 415 is formed on the substrate 410. For example, an insulator film is deposited on the substrate 410 by plasma CVD.

More specifically, first, a glass substrate is prepared as the substrate 410, and a silicon oxide film, a silicon nitride film, a silicon oxynitride film, or a laminated film of these films is deposited as the buffer layer 415 on the substrate 410. The buffer layer 415 has a film thickness of approximately 100 nm to 300 nm. The film deposition temperature at this time is, for example, in the range of 350° C. to 400° C.

Note that the provision of the buffer layer 415 improves adhesion properties between the oxide semiconductor layer 440 and the substrate 410. The buffer layer 415 also suppresses diffusion of the elements of the substrate 410 into the oxide semiconductor layer 440.

Formation of Oxide Semiconductor Layer

Next, an oxide semiconductor layer 440 of a predetermined shape is formed above the substrate 410, i.e., on the buffer layer 415. For example, an oxide semiconductor film is deposited on the buffer layer 415 by sputtering. The oxide semiconductor film is then processed by photolithography and etching to form the oxide semiconductor layer 440 of a predetermined shape. Specific film deposition conditions and process conditions are the same as the film deposition conditions and process conditions for the oxide semiconductor layer 140 according to Embodiment 1.

Formation of First Oxide Film

Next, a first oxide film 431 is formed on the oxide semiconductor layer 440 as illustrated in (b) in FIG. 17A. For example, the first oxide film 431 is deposited by plasma CVD to cover the oxide semiconductor layer 440.

More specifically, the first oxide film 431 is formed by depositing a silicon oxide film with a thickness of 5 nm to 40 nm on the buffer layer 415 to cover the oxide semiconductor layer 440. The film deposition temperature at this time is, for example, in the range of 260° C. to 290° C. The silicon oxide film may be deposited using, for example, a silane gas ($SiH_4$) and a nitrous oxide gas ($N_2O$) as introduction gases.

Plasma Treatment

Next, plasma treatment, which is one example of the oxidation processing, is performed as illustrated in (c) in FIG. 17A. That is, plasma treatment is performed after the formation of the first oxide film 431 and before the formation of a second oxide film 432.

More specifically, plasma 490 is generated using a nitrous oxide gas ($N_2O$) within the chamber that is used for the film deposition of the first oxide film 431. The time required to generate the plasma 490, i.e., plasma treatment time, is in the range of, for example, 60 seconds to 180 seconds. The plasma treatment temperature, i.e., substrate temperature, is in the range of 260° C. to 390° C.

Formation of Second Oxide Film

Next, the second oxide film 432 is formed on the first oxide film 431 as illustrated in (d) in FIG. 17A. For example, a silicon oxide film with a film thickness of 80 nm to 300 nm is deposited on the first oxide film 431 to form the second oxide film 432. The film deposition temperature at this time is, for example, in the range of 260° C. to 390° C. For example, the introduction gas is the same as the introduction gas used to deposit the first oxide film 431. The film deposition temperature is, for example, the same as the substrate temperature for the plasma treatment.

Note that the first oxide film 431 and the second oxide film 432 form a gate insulating layer of the thin-film transistor 400. After the formation of the second oxide film 432, heat treatment (annealing) may be performed at a predetermined temperature.

Formation of Gate Electrode

Next, a gate electrode 420 of a predetermined shape is formed above the substrate 410 as illustrated in (a) in FIG. 17B. For example, a metal film with a thickness of 30 nm to 300 nm is deposited on the gate insulating layer 430 by sputtering and processed by photolithography and etching to form the gate electrode 420 of a predetermined shape.

Specific film deposition conditions and process conditions are the same as the film deposition conditions and process conditions for the gate electrode 120 according to Embodiment 1.

Formation of Interlayer Insulating Layer

Next, an interlayer insulating layer 470 is formed as illustrated in (b) in FIG. 17B. For example, the interlayer insulating layer 470 may have the same three-layer structure as the structure of the interlayer insulating layer 170 according to Embodiment 1. Specific film deposition conditions are the same as the film deposition conditions for the interlayer insulating layer 170 according to Embodiment 1.

Formation of Upper Electrode, Drain Electrode, and Source Electrode

Next, an upper electrode 421, a drain electrode 460d, and a source electrode 460s are formed on the interlayer insulating layer 470 as illustrated in (b) in FIG. 17B. More specifically, first, part of the interlayer insulating layer 470 is removed by etching to form contact holes. That is, the contact holes for exposing part of the gate electrode 420 and part of the oxide semiconductor layer 440 are formed in the interlayer insulating layer 470. Specific process conditions are the same as the process conditions for the interlayer insulating layer 170 according to Embodiment 1.

Then, a metal film is deposited on the interlayer insulating layer 470 by sputtering to fill in the formed contact holes. For example, a 20-nm Mo film, a 300-nm Cu film, and a 20-nm alloy film (CuMn film) of copper and manganese are sequentially laminated on the interlayer insulating layer 470. Thereafter, the laminated metal films are processed by photolithography and etching to form the upper electrode 421, the drain electrode 460d, and the source electrode 460s of predetermined shapes. The wet etching of the Mo film, the Cu film, and the CuMn film may use, for example, a chemical solution obtained by mixing a hydrogen peroxide solution ($H_2O_2$) and organic acid.

Through the steps described above, the top-gate type thin-film transistor 400 is manufactured. Note that other layers such as the organic EL elements 40 are further laminated in subsequent steps.

In the case of the top-gate type thin-film transistor 400, oxygen defects within the oxide semiconductor layer 440 and oxygen defects at the interface between the oxide semiconductor layer 440 and the first oxide film 431 are corrected, and therefore the uniformity and reliability of characteristics are improved, as with the case of the bottom-gate type thin-film transistor 100.

Other Embodiments

As described above, an embodiment of the present disclosure is described by way of example of the technique disclosed in the present application. The technique of the present disclosure is, however, not limited to this embodiment and is also applicable to other embodiments obtained by appropriate modifications, replacements, addition, and omission.

Other embodiments are illustrated below by way of example.

For example, while $N_2O$ plasma treatment is taken as an example of the oxidation processing in the above-described embodiment, the present disclosure is not limited to this example. Instead of using $N_2O$, oxygen plasma treatment using an oxygen gas ($O_2$) may be performed. For example, when a silane gas and an oxygen gas are used as film deposition gases for the silicon oxide film, oxygen plasma treatment using an oxygen gas may be performed so that both film deposition and plasma treatment can be continuously performed within the same chamber. This increases convenience in productivity such as simplifying the apparatus and reducing cost.

The oxidation processing may be gas treatment using an oxidative gas or heat treatment (annealing) performed at a predetermined temperature, instead of plasma treatment.

For example, the oxidation processing may be performed under proper conditions before the film deposition of the first oxide film 151. More specifically, heat treatment, plasma treatment, or a combination of these treatments may be performed after the film deposition of the oxide semiconductor layer 140 and before the film deposition of the first oxide film 151.

For example, the heat treatment may be annealing performed at a temperature of 300° C. to 350° C. for about an hour in dry air. The plasma treatment may be performed using a nitrous oxide gas and under the same conditions as the aforementioned "$N_2O$ plasma treatment conditions." At this time, the substrate temperature during the plasma treatment is the same as the film deposition temperature of the first oxide film 151, and the plasma treatment time is, for example, within 30 seconds.

This reduces the number of oxygen defects within the oxide semiconductor layer 140 and removes impurities from the surface of the oxide semiconductor layer 140.

While the above-described embodiment takes the example of the case where the first oxide film 151 and the second oxide film 152 are both silicon oxide films, the present disclosure is not limited to this example. For example, the first oxide film 151 and the second oxide film 152 may be different oxide films. For example, the first oxide film 151 may be an aluminum oxide film, and the second oxide film 152 may be a silicon oxide film.

While the above-described embodiment takes the example of the case where the channel protective layer 150 has a two-layer structure including the first oxide film 151 and the second oxide film 152, the present disclosure is not limited to this example. The channel protective layer 150 may include three or more layers of oxide film. More specifically, a third oxide film may be laminated on the second oxide film 152.

While the above-described embodiment describes the organic EL display device 10 as a display device including the thin-film transistor 100, the thin-film transistor 100 according to the above embodiment is also applicable to other display devices such as liquid crystal display devices that use an active matrix substrate.

The display devices (display panels) such as the above-described organic EL display device 10 are usable as flat panel displays and are applicable to various types of electronic devices such as TV sets, personal computers, or mobile phones that include a display panel. In particular, the display devices are suitable for large-screen, high definition display devices.

As described above, embodiments are described by way of example of the technique according to the present disclosure. Attached drawings and detailed descriptions are provided to describe embodiments.

Accordingly, the constituent elements described in the attached drawings and the detailed descriptions may include not only essential constituent elements necessary to solve the problem but also constituent elements that are not essential to solve the problem, in order to illustrate the above-described technique. Therefore, such unessential constituent elements listed in the attached drawings or the detailed descriptions should not immediately be regarded as essential constituent elements.

The above-described embodiments are merely illustrative examples of the technique according to the present disclosure, and therefore, various modifications, replacement, addition, and omission are possible within the scope of claims or within the equivalent range of the claims.

INDUSTRIAL APPLICABILITY

The thin-film transistor substrate and the method of manufacturing the same according to the present disclosure are applicable to, for example, display devices such as organic EL display devices and methods of manufacturing the same.

The invention claimed is:

1. A thin-film transistor substrate manufactured by a method comprising:
    forming an oxide semiconductor layer above a substrate;
    forming a first oxide film on the oxide semiconductor layer;
    performing oxidation processing on the oxide semiconductor layer after formation of the first oxide film, wherein a duration of the oxidation processing increases with a film deposition temperature of the first oxide film; and
    forming a second oxide film on the first oxide film after the oxidation processing,
    wherein in concentration profiles of elements in a direction of lamination,
    a concentration profile of fluorine elements shows a peak in proximity to a boundary between the first oxide film and the second oxide film,
    a concentration profile of nitric oxide shows that a concentration in proximity to the boundary is higher than a concentration in proximity to a center of the second oxide film, and
    a concentration profile of hydrogen elements discontinuously changes in proximity to the boundary.

2. The thin-film transistor substrate according to claim 1, wherein a film deposition temperature of the first oxide film is 270° C. or higher.

3. The thin-film transistor substrate according to claim 2, wherein a duration of the oxidation processing increases with a film thickness of the first oxide film.

4. The thin-film transistor substrate according to claim 1, wherein a duration of the oxidation processing increases with a film thickness of the first oxide film.

5. The thin-film transistor substrate according to claim 1, wherein the first oxide film has a film thickness that is greater than or equal to 5 nm and less than or equal to 40 nm.

6. The thin-film transistor substrate according to claim 1, wherein a duration of the oxidation processing increases with a film deposition temperature of the second oxide film.

7. The thin-film transistor substrate according to claim 1, wherein the oxidation processing includes plasma treatment.

8. The thin-film transistor substrate according to claim 7, wherein the plasma treatment is performed using a nitrous oxide gas for a period of time that is greater than or equal to 5 seconds and less than or equal to 300 seconds.

9. The thin-film transistor substrate according to claim 1, wherein the first oxide film and the second oxide film are silicon oxide films.

10. The thin-film transistor substrate according to claim 1, wherein the oxide semiconductor layer is a transparent amorphous oxide semiconductor.

11. The thin-film transistor substrate according to claim 1, wherein the oxide semiconductor layer is InGaZnO.

12. A thin-film transistor substrate comprising:
    a substrate;
    an oxide semiconductor layer;
    a first oxide film; and
    a second oxide film,
    the oxide semiconductor layer, the first oxide film, and the second oxide film being sequentially laminated above the substrate,
    wherein in concentration profiles of elements in a direction of lamination,
    a concentration profile of fluorine elements shows a peak in proximity to a boundary between the first oxide film and the second oxide film,
    a concentration profile of nitric oxide shows that a concentration in proximity to the boundary is higher than a concentration in proximity to a center of the second oxide film, and
    a concentration profile of hydrogen elements discontinuously changes in proximity to the boundary.

13. A thin-film transistor substrate manufactured by a method comprising:
    forming an oxide semiconductor layer above a substrate;
    forming a first oxide film on the oxide semiconductor layer;
    performing oxidation processing on the oxide semiconductor layer after formation of the first oxide film; and
    forming a second oxide film on the first oxide film after the oxidation processing, wherein a film deposition temperature of the second oxide film is the same as a temperature during the oxidation processing,
    wherein in concentration profiles of elements in a direction of lamination,
    a concentration profile of fluorine elements shows a peak in proximity to a boundary between the first oxide film and the second oxide film,
    a concentration profile of nitric oxide shows that a concentration in proximity to the boundary is higher than a concentration in proximity to a center of the second oxide film, and
    a concentration profile of hydrogen elements discontinuously changes in proximity to the boundary.

14. The thin-film transistor substrate according to claim 13, wherein the oxidation processing includes plasma treatment.

15. The thin-film transistor substrate according to claim 14, wherein the plasma treatment is performed using a nitrous oxide gas for a period of time that is greater than or equal to 5 seconds and less than or equal to 300 seconds.

16. The thin-film transistor substrate according to claim 13, wherein the first oxide film and the second oxide film are silicon oxide films.

17. The thin-film transistor substrate according to claim 13,
    wherein the oxide semiconductor layer is a transparent amorphous oxide semiconductor.

18. The thin-film transistor substrate according to claim 13,
    wherein the oxide semiconductor layer is InGaZnO.

* * * * *